(12) United States Patent
Kagano et al.

(10) Patent No.: US 10,347,068 B2
(45) Date of Patent: Jul. 9, 2019

(54) CAPACITANCE DETECTION DEVICE AND IMAGE READING DEVICE

(71) Applicant: Mitsubishi Electric Corporation, Chiyoda-ku (JP)

(72) Inventors: Miki Kagano, Chiyoda-ku (JP); Hiroshi Araki, Chiyoda-ku (JP); Toshiaki Shoji, Chiyoda-ku (JP); Hideki Matsui, Chiyoda-ku (JP); Kazuya Makabe, Chiyoda-ku (JP); Tomoyuki Miyata, Chiyoda-ku (JP); Tomokazu Ogomi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/096,497

(22) PCT Filed: Sep. 25, 2017

(86) PCT No.: PCT/JP2017/034570
§ 371 (c)(1),
(2) Date: Oct. 25, 2018

(87) PCT Pub. No.: WO2018/056443
PCT Pub. Date: Mar. 29, 2018

(65) Prior Publication Data
US 2019/0139349 A1 May 9, 2019

(30) Foreign Application Priority Data
Sep. 26, 2016 (JP) ................................ 2016-186875

(51) Int. Cl.
*G07D 7/026* (2016.01)
*G01V 3/08* (2006.01)
(Continued)

(52) U.S. Cl.
CPC ......... *G07D 7/026* (2013.01); *G01R 27/2605* (2013.01); *G01V 3/088* (2013.01);
(Continued)

(58) Field of Classification Search
USPC .......................................................... 382/135
See application file for complete search history.

(56) References Cited

U.S. PATENT DOCUMENTS

2006/0152231 A1 7/2006 Konermann et al.
2010/0117295 A1* 5/2010 Miyamoto ............... B65H 7/02
271/265.04

(Continued)

FOREIGN PATENT DOCUMENTS

JP 41-20975 12/1966
JP 61-88387 A 5/1986
(Continued)

OTHER PUBLICATIONS

International Search Report dated Dec. 19, 2017 in PCT/JP2017/034570 Filed Sep. 25, 2017.

*Primary Examiner* — Amandeep Saini
(74) *Attorney, Agent, or Firm* — Oblon, McClelland, Maier & Neustadt, L.L.P.

(57) ABSTRACT

A capacitance detection device includes a first electrode and a second electrode that at least partially face each other on opposite sides of a transfer path. An oscillator circuit forms an electric field between the first electrode and the second electrode. A detection circuit detects a change in capacitance between the first electrode and the second electrode. At least one of the oscillator circuit and the detection circuit is included in each of a first board and a second board. The first board is disposed such that a side surface of the first board faces the first electrode in an electric field direction, and the second board is disposed such that a side surface of the
(Continued)

second board faces the second electrode in the electric field direction.

17 Claims, 24 Drawing Sheets

(51) Int. Cl.
    *G06K 9/00*     (2006.01)
    *G07D 7/189*     (2016.01)
    *G07D 7/121*     (2016.01)
    *G01R 27/26*     (2006.01)

(52) U.S. Cl.
    CPC ......... *G06K 9/00624* (2013.01); *G07D 7/121* (2013.01); *G07D 7/189* (2017.05)

(56) References Cited

U.S. PATENT DOCUMENTS

| | | |
|---|---|---|
| 2011/0309572 A1 | 12/2011 | Miyamoto |
| 2016/0122946 A1 | 5/2016 | Mäntylä |

FOREIGN PATENT DOCUMENTS

| | | |
|---|---|---|
| JP | 1-209309 A | 8/1989 |
| JP | 2001-240271 A | 9/2001 |
| JP | 2005-10968 A | 1/2005 |
| WO | WO 2009/013787 A1 | 1/2009 |

\* cited by examiner

US 10,347,068 B2

CAPACITANCE DETECTION DEVICE AND IMAGE READING DEVICE

TECHNICAL FIELD

The present disclosure relates to a capacitance detection device for detecting a change in capacitance between electrodes caused by a sheet-like detection target such as banknotes or securities, and an image reading device having the capacitance detection device.

BACKGROUND ART

A detection device has been proposed that detects a foreign object, such as a tiny piece of tape, attached on a surface of a sheet-like detection target such as banknotes or securities by detecting capacitance between electrodes caused by the detection target (see Patent Literature 1). A device for determining whether a detection target is authentic is also proposed that includes a capacitance sensor for detecting a change in capacitance and a sensor for detecting other information (see Patent Literature 2). The capacitance sensor that is a device for detecting the change in capacitance as disclosed in Patent Literatures 1 and 2 detects the change in capacitance between electrodes caused by the detection target passing between the electrodes of a parallel-plate capacitor.

The devices disclosed in Patent Literatures 1 and 2 are intended to be applied to an apparatus necessary for determination on authentication of the sheet-like detection target such as banknotes or securities. Examples of such an authentication determination apparatus include an automated teller/telling machine (ATM), a money changer, a cash dispenser, a ticket machine, a vending machine, and the like. To determine whether the detection target is authentic, some ATMs include a paper thickness detection device that includes a roller and an ultrasonic sensor and detects a thickness of paper. Use of the paper thickness detection device enables determination of banknotes and securities having an unusual thickness of paper. Attachment of foreign objects on the banknotes and securities can be detected based on the determination of the paper thickness, the change in capacitance, and the like.

For reuse, damaged banknotes and securities may be repaired with, for example, a transparent resin tape. To prevent circulation of the repaired banknotes and securities on the market, the ATM detects the attachment of foreign objects on the banknotes and securities that are the detection target, and collects the detected banknotes and securities inside the ATM. As disclosed in Patent Literature 2, for example, the ATM detects banknotes and securities repaired with a tape, paper, or the like. When such a detected banknote is a banknote with just a tear repaired, the banknote is collected into a reject box, whereas when the detected banknote is an altered banknote made by connecting strip-like pieces of banknote together, the banknote is returned to a banknote depositing and dispensing port. A banknote thickness sensor disclosed in Patent Literature 2 detects that the transferred detection target is at least double-stacked.

CITATION LIST

Patent Literature

Patent Literature 1: Unexamined Japanese Patent Application Kokai Publication No. 2001-240271

Patent Literature 2: Unexamined Japanese Patent Application Kokai Publication No. 2005-10968

SUMMARY OF INVENTION

Technical Problem

As described above, the paper thickness detection device is necessary for preventing circulation of the repaired banknotes and securities. However, the paper thickness detection device including a roller and an ultrasonic sensor increases size and cost of the ATM. To address this, as disclosed in Patent Literature 1, detecting the attachment of the foreign objects instead of the thickness of the detection target is contemplated as one possible solution to prevent circulation of the repaired banknotes and securities. However, the device for capacitance detection disclosed in Patent Literature 1 adopts, as a shape of capacitance detection electrodes, a three-dimensional shape that is not just three-dimensional but is more likely to result in an increase in size. One factor of the three-dimensional shape more likely to result in the increase in size is the necessity for chamfering corners of dielectric materials covering electrodes. Thus the device for capacitance detection disclosed in Patent Literature 1 has a complex structure and has limitations in size reduction and disassembly of the device.

Patent Literature 2 discloses an upper transfer roller and a lower transfer roller that are provided for transferring a detection target between an upper transfer guide and a lower transfer guide. The capacitance sensor disclosed in Patent Literature 2 has two trapezoidal projections each located in alignment with the upper transfer roller and lower transfer roller. The capacitance sensor is formed by providing an application electrode and a detection electrode on surfaces of the two projections on the sides facing the detection target. Thus the capacitance sensor disclosed in Patent Literature 2 has a complex structure and has limitations in size reduction and disassembly of the device.

As described above, the device for capacitance detection disclosed in Patent Literature 1 and the capacitance sensor disclosed in Patent Literature 2 suffer from having complex structures. Such a device or sensor also suffers from not having a high level of compatibility with a device or sensor for detecting information other than the change in capacitance caused by the detection target. Representative examples of the device or sensor for detecting information other than the change in capacitance include sensors disclosed in Patent Literature 2 and the above-described ultrasonic sensor. Patent Literature 2 discloses an image sensor for detecting a pattern (image) on the detection target, a magnetic sensor for detecting a magnetic pattern of the detection target, and a fluorescence sensor for detecting a fluorescence image of the detection target. The fluorescence sensor may be one function of the image sensor.

The present disclosure is made in view of the above circumstances, and an objective of the present disclosure is to provide a capacitance detection device having a simple structure and a reduced size.

Solution to Problem

To achieve the above objective, a capacitance detection device of the present disclosure includes a first electrode and a second electrode, an oscillator circuit, a detection circuit, and a first board and a second board. The first electrode and the second electrode at least partially face each other on opposite sides of a transfer path extending along a transfer direction in which a sheet-like detection target is transferred. The oscillator circuit forms an electric field between the first electrode and the second electrode. The detection circuit detects a change in capacitance between the first electrode and the second electrode. At least one of the oscillator circuit and the detection circuit is formed on the first board and the second board. The first board has a side surface facing the first electrode in an electric field direction that is a direction in which the first electrode and the second electrode at least partially face each other. The second board has a side surface facing the second electrode in the electric field direction.

Advantageous Effects of Invention

According to the present disclosure, a capacitance detection device having a simple structure and a reduced size can be provided by arranging the first board with a side surface facing the first electrode in the electric field direction and the second board with a side surface facing the second electrode in the electric field direction.

DESCRIPTION OF EMBODIMENTS

Figure 1:
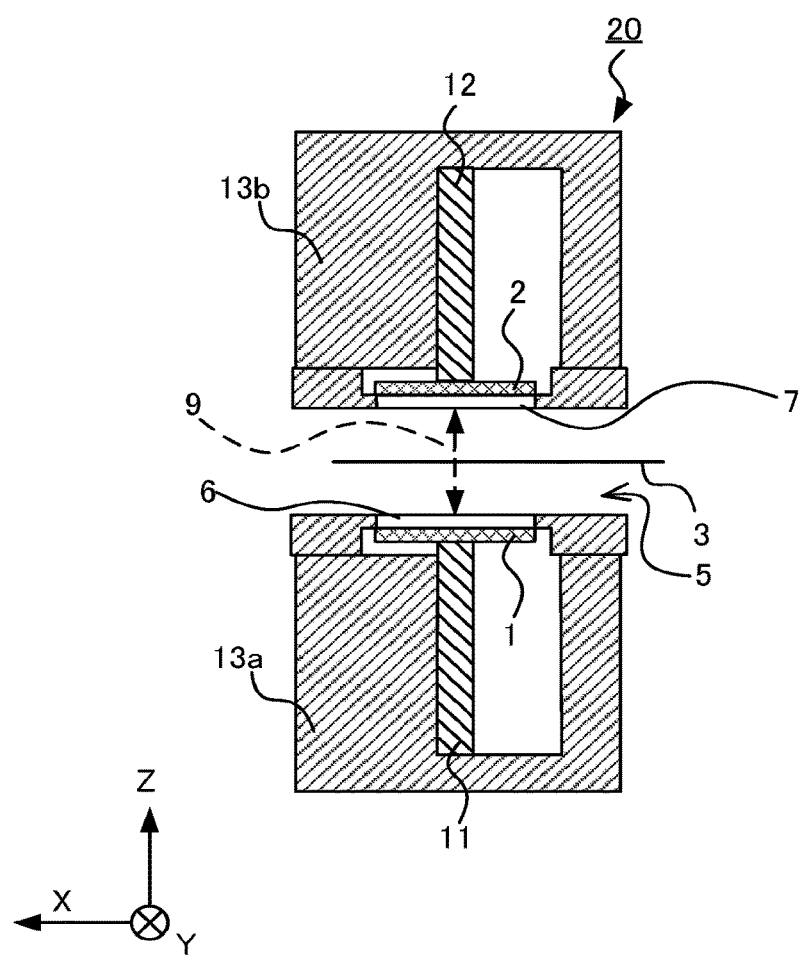
FIG. 1 is a cross-sectional view of a capacitance detection device according to Embodiment 1 of the present disclosure, taken along a cross section defined by a transfer direction and an electric field direction.

Embodiments of the present disclosure are described hereinafter with reference to the drawings. In the following description of embodiments, similar components are denoted by the same reference signs, and the descriptions thereof may be omitted. In the drawings, the X-axis direction is the transfer direction and indicates a direction in which the detection target is transferred. The Y-axis direction is a direction perpendicular to the transfer direction in a transfer plane and indicates an arrangement direction. The Z-axis direction is a direction perpendicular to the X-axis direction and the Y-axis direction and indicates an electric field direction. The transfer direction includes not only the transfer direction defined in a case in which the detection target is transferred, but also a direction of movement of the capacitance detection device or the image reading device in a case in which the capacitance detection device or the image reading device is moved. The arrangement direction is also referred to as a main scanning direction. The transfer direction is also referred to as a sub-scanning direction. The electric field direction is also referred to as an optical axis direction. The main scanning direction, the sub-scanning direction, and the optical axis direction are described in detail in the description of the image reading device.

Embodiment 1

A main structure of a capacitance detection device 20 (image reading device 40) according to Embodiment 1 is described with reference to FIGS. 1 to 9. In FIG. 1, a first electrode 1 and a second electrode 2 face each other on opposite sides of a transfer path 5 that extends along the transfer direction in which a sheet-like detection target 3 is transferred. The detection target 3 is transferred in a positive X-axis direction. The detection target 3 is, for example, printed matter including banknotes and securities. A first plate 6 is an insulating plate on which the first electrode 1 is formed. A second plate 7 is an insulating plate on which the second electrode 2 is formed. The first electrode 1 and the second electrode 2 may be formed using printing techniques. The first electrode 1 and the second electrode 2 each have a transfer-direction length of a few millimeters to a few centimeters. The first electrode 1 and the second electrode 2 need not have the same length in the transfer direction. In addition, the first electrode 1 and the second electrode 2 at least partially face each other in the electric field direction. In other words, the first electrode 1 and the second electrode 2 at least partially extend over each other in the transfer direction. That is, the first electrode 1 may be out of line with the second electrode 2 in the transfer direction as long as the electrodes serve as the parallel-plate capacitor. Similarly, the first electrode 1 may be out of line with the second electrode 2 in the arrangement direction.

In FIG. 1, an oscillator circuit forms an electric field 9 between the first electrode 1 and the second electrode 2. That is, the electric field 9 is formed by the oscillator circuit in at least a part of a space in the transfer path 5. In the drawings, the electric field 9 is indicated by dashed lines with arrows at both ends. The electric field 9 is formed generally along the Z-axis direction. The electric field 9 is formed in a predetermined interval between the first plate 6 and the second plate 7, that is, a gap d. The gap d has an electric-field-direction length between the first plate 6 and the second plate 7. Illustration of the gap d is omitted. A detection circuit detects a change in capacitance between the first electrode 1 and the second electrode 2. At least one of the oscillator circuit and the detection circuit is formed on a first board 11 and a second board 12. In an example of FIG. 1, the first board 11 has a side surface that faces the first electrode 1 (first plate 6) in the electric field direction. The second board 12 has a side surface that faces the second electrode 2 (second plate 7) in the electric field direction. The first board 11 and the second board 12 each have a thin-plate shape having a transfer-direction length of the side surface that is shorter than an electric-field-direction length of the main surface of the board.

A housing 13a and a housing 13b illustrated in FIG. 1 are housings of the capacitance detection device 20. The housing 13a contains the first board 11. The housing 13b contains the second board 12. The first board 11 and the second board 12 are circuit boards extending in the electric field direction. Each embodiment is described on the premise that the oscillator circuit is formed on the first board 11 and the detection circuit is formed on the second board 12. Of course, the detection circuit may be formed on the first board 11 and the oscillator circuit may be formed on the second board 12. The first plate 6 on which the first electrode 1 is formed toward the housing 13a interior side is provided on a surface of the housing 13a on the transfer path 5 side. The second plate 7 on which the second electrode 2 is formed on the housing 13b interior side is provided on a surface of the housing 13b on the transfer path 5 side. The transfer path 5 refers to a path in which the detection target 3 passes in a space between the housing 13a and the housing 13b. The gap d refers to a distance between the housing 13a and the housing 13b in the electric field direction.

In the capacitance detection device 20 illustrated in FIG. 1, the detection target 3 is transferred in the transfer direction in the transfer path 5 between the first plate 6 and the second plate 7 that are spaced apart from each other with the gap d. The first electrode 1 (first plate 6) and the second electrode 2 (second plate 7) constitute a parallel-plate capacitor having the gap d and form the electric field 9 in the transfer path 5. Thus insertion of the dielectric detection target 3 into the parallel-plate capacitor increases an amount of stored charge, thereby causing a change in capacitance of the parallel-plate capacitor. The change in the capacitance of the parallel-plate capacitor can be detected by the oscillator circuit and the detection circuit. When the capacitance to be detected is known in advance, the transferred detection target 3 can be identified based on a detection value of the capacitance.

This function of identification of the detection target 3 may be incorporated into the detection circuit. An identification circuit performing the identification function may be formed outside the detection circuit. The identification circuit is described later in detail. When a dielectric foreign object such as a tape is attached on the detection target 3, the amount of stored charge in the parallel-plate capacitor increases and the capacitance increases, compared with when no foreign object is attached on the detection target 3.

Figure 2:
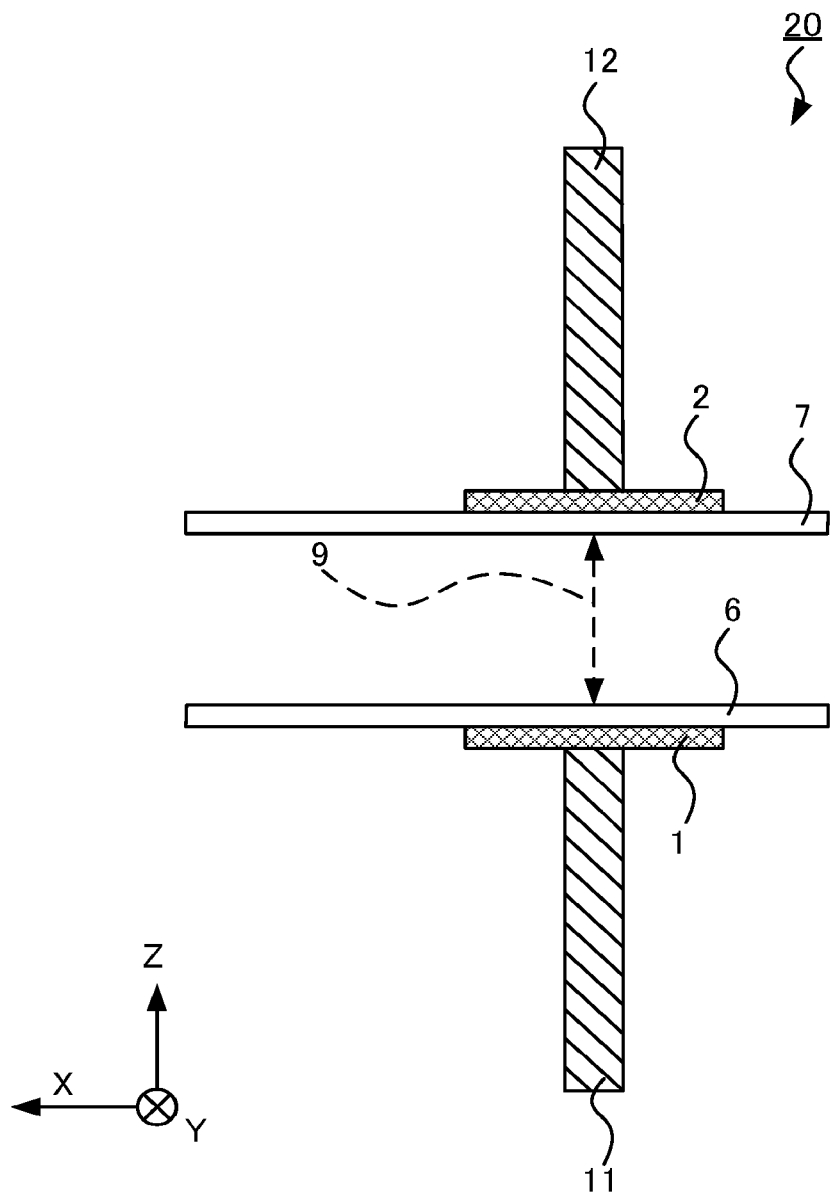
FIG. 2 is a cross-sectional view of main parts of the capacitance detection device according to Embodiment 1, taken along a cross section defined by the transfer direction and the electric field direction.
Figure 3:
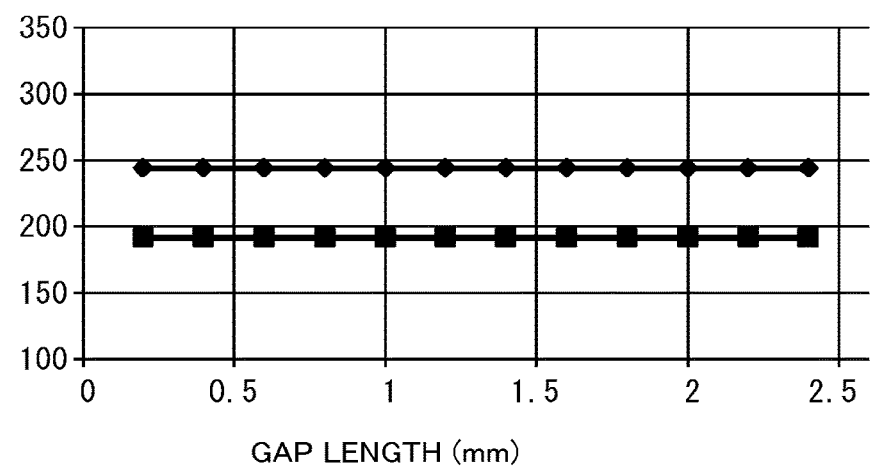
FIG. 3 is a graph illustrating an example of detection values of the capacitance detection device according to Embodiment 1.
Figure 4:
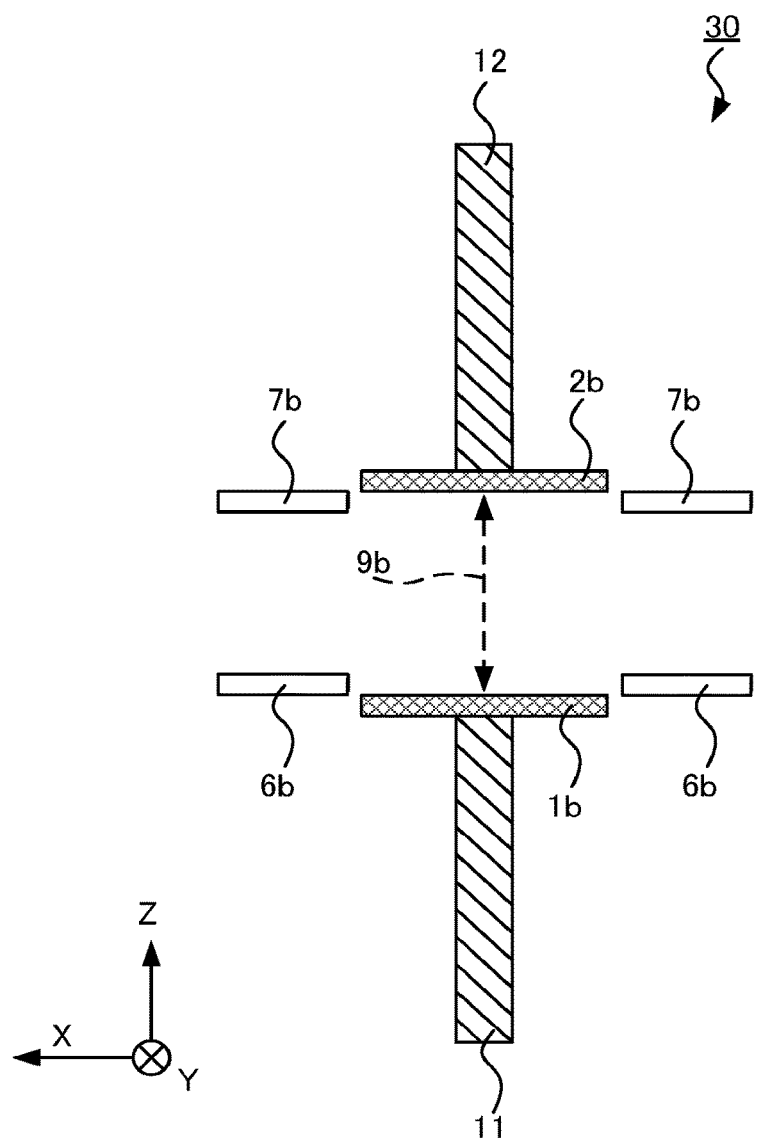
FIG. 4 is a cross-sectional view illustrating main parts of a comparative example of the capacitance detection device according to Embodiment 1, taken along a cross section defined by the transfer direction and the electric field direction.
Figure 5:
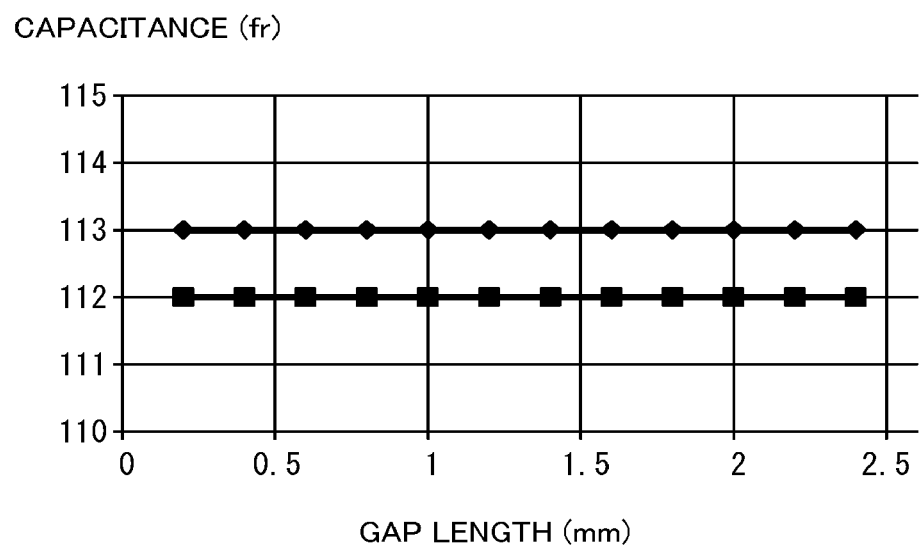
FIG. 5 is a graph illustrating an example of detection values of the comparative example of the capacitance detection device according to Embodiment 1.

Next, operation of the capacitance detection device 20 according to Embodiment 1 is further described with reference to FIGS. 2 to 5. FIGS. 4 and 5 are drawings relating to a capacitance detection device 30 that is a comparative example of the capacitance detection device 20 according to Embodiment 1. As illustrated in FIG. 2, the electric field 9 is formed between the first plate 6 on which the first electrode 1 is formed and the second plate 7 on which the second electrode 2 is formed, that is, is formed in the gap d. FIG. 3 is a graph illustrating detection values of the capacitance between the first electrode 1 and the second electrode 2 with the gap d set to 2.5 mm. The horizontal axis of FIG. 3 indicates how far from the first plate 6 the detection target 3 is transferred. That is, the gap length of 0 mm indicates transfer at the surface of the first plate 6, and the gap length of 2.5 mm indicates transfer at the surface of the second plate 7. The vertical axis of FIG. 3 indicates the detection values of the capacitance. In FIG. 3, black rhombuses indicate the detection values obtained when a tape was attached on the detection target 3. Black squares indicate the detection values obtained when a tape was not attached on the detection target 3.

The detection values of the capacitance illustrated in FIG. 3 show that, regardless of the presence or absence of the tape, variations in the gap length did not change the detection values of the capacitance. This graph also shows that the detection values of the capacitance were large values in a range of approximately 200 to 250 fr. This results from increased capacitance of the parallel-plate capacitor. The increased capacitance of the parallel-plate capacitor occurs due to arrangement such that the first electrode 1 and the second electrode 2 that are detection electrodes are respectively disposed in contact with the first plate 6 and the second plate 7 that are dielectrics.

In contrast, the capacitance detection device 30, which is a comparative example of the capacitance detection device 20 according to Embodiment 1, is described. In the capacitance detection device 30 illustrated in FIG. 4, a first electrode 1b and a second electrode 2b are not formed respectively on a first plate 6b and a second plate 7b that are dielectrics. The first electrode 1b and the second electrode 2b each have a length of a few millimeters to a few centimeters. The first electrode 1b and the second electrode 2b are made of metal plate. The first board 11 is disposed such that a side surface of the first board 11 faces the first electrode 1b in the electric field direction. Similarly, the second board 12 is disposed such that a side surface of the second board 12 faces the second electrode 2b in the electric field direction. As illustrated in FIG. 4, an electric field 9b is formed between the first electrode 1b and the second electrode 2b. To prevent the detection target 3 transferred along the transfer direction from being in contact with the first electrode 1b and the second electrode 2b, the first plate 6b and the second plate 7b facing each other on opposite sides of the transfer path 5 are disposed on each of the upstream side and the downstream side in the transfer direction. The first plate 6b and the second plate 7b may be disposed on one of the upstream side and the downstream side in the transfer direction.

FIG. 5 is a graph illustrating detection values of the capacitance between the first electrode 1b and the second electrode 2b of the capacitance detection device 30 with a distance between the first electrode 1b and the second electrode 2b being set to 2.5 mm. The horizontal axis of FIG. 5 indicates how far from the first electrode 1b the detection target 3 is transferred. That is, the gap length of 0 mm indicates transfer at the surface of the first electrode 1b, and the gap length of 2.5 mm indicates transfer at the surface of the second electrode 2b. The vertical axis of FIG. 5 indicates the detection values of the capacitance. FIG. 5 is annotated similarly to that of FIG. 3.

The detection values of the capacitance illustrated in FIG. 5 show that, regardless of the presence or absence of a tape, variations in the gap length did not change the detection values of the capacitance. However, this graph shows that the detection values of the capacitance were small values in a range of approximately 112 to 113 fr compared with those of the capacitance detection device 20 according to Embodiment 1. This occurs due to arrangement in which the first electrode 1b and the second electrode 2b that are detection electrodes are not respectively disposed in contact with the first plate 6b and the second plate 7b that are dielectrics.

Figure 6:
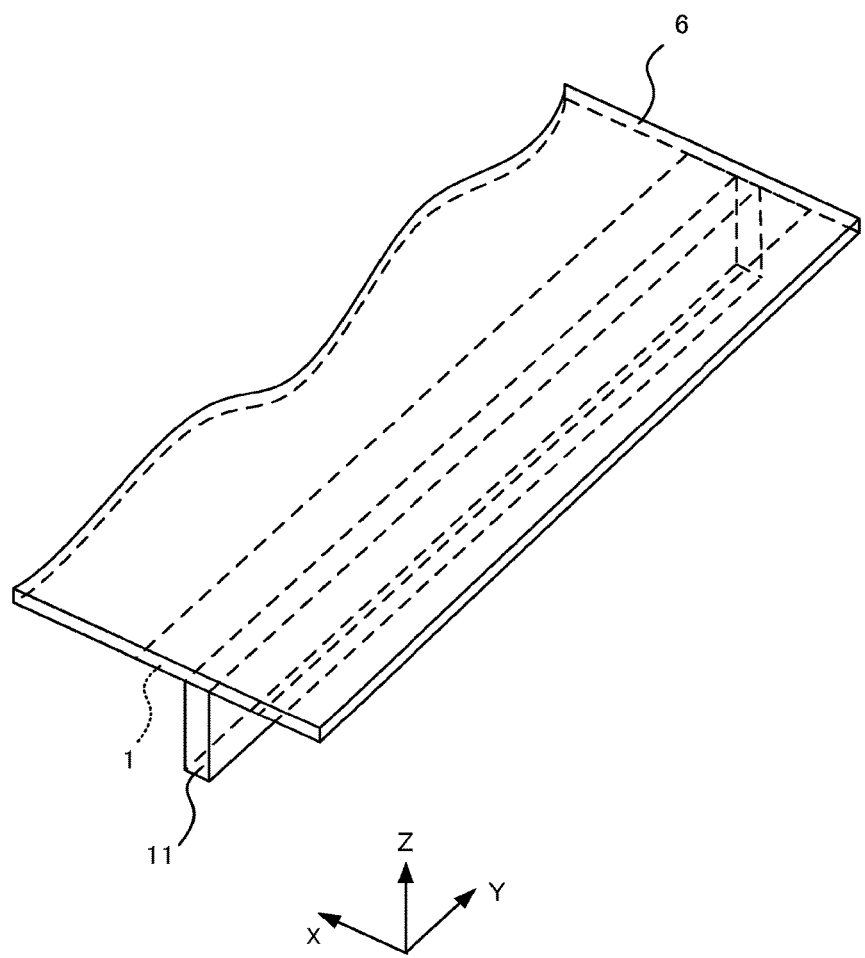
FIG. 6 is a perspective view of main parts of the capacitance detection device according to Embodiment 1.

FIG. 6 is a perspective view illustrating main parts on the housing 13a side of the capacitance detection device according to Embodiment 1. In FIG. 6, a single first electrode 1 is disposed along an arrangement direction. The arrangement direction matches the longitudinal direction or transverse direction of the detection target 3. That is, the first electrode 1 has an arrangement-direction length that is equal to or longer than the longitudinal-direction length or the transverse-direction length of the detection target 3. The determination of whether the arrangement direction matches the longitudinal direction or the transverse direction is based on the direction in which the detection target 3 is transferred. The same applies to the following description including the description relating to the image reading device 40 and an image reader 14. The first electrode 1 and the first board 11 are depicted partially by dashed lines due to location on the rear side of the first plate 6, that is, on the housing 13a side. Although not illustrated, in main parts on the housing 13b side as well, a single second electrode 2 is disposed along the arrangement direction. That is, the second electrode 2 has an arrangement-direction length that is equal to or longer than the longitudinal-direction length or the transverse-direction length of the detection target 3. When the capacitance detection device 20 has a single first electrode 1 and a single second electrode 2, the capacitance detection device 20 may have a single oscillator circuit and a single detection circuit.

The single first electrode 1 arranged along the arrangement direction illustrated in FIG. 6 and the single second electrode 2 arranged along the arrangement direction constitute a parallel-plate capacitor. As described above, the first electrode 1 may be out of line with the second electrode 2 in the transfer direction as long as the first electrode 1 and the second electrode 2 can serve as the parallel-plate capacitor. Similarly, the first electrode 1 may be out of line with the second electrode 2 in the arrangement direction.

Figure 7:
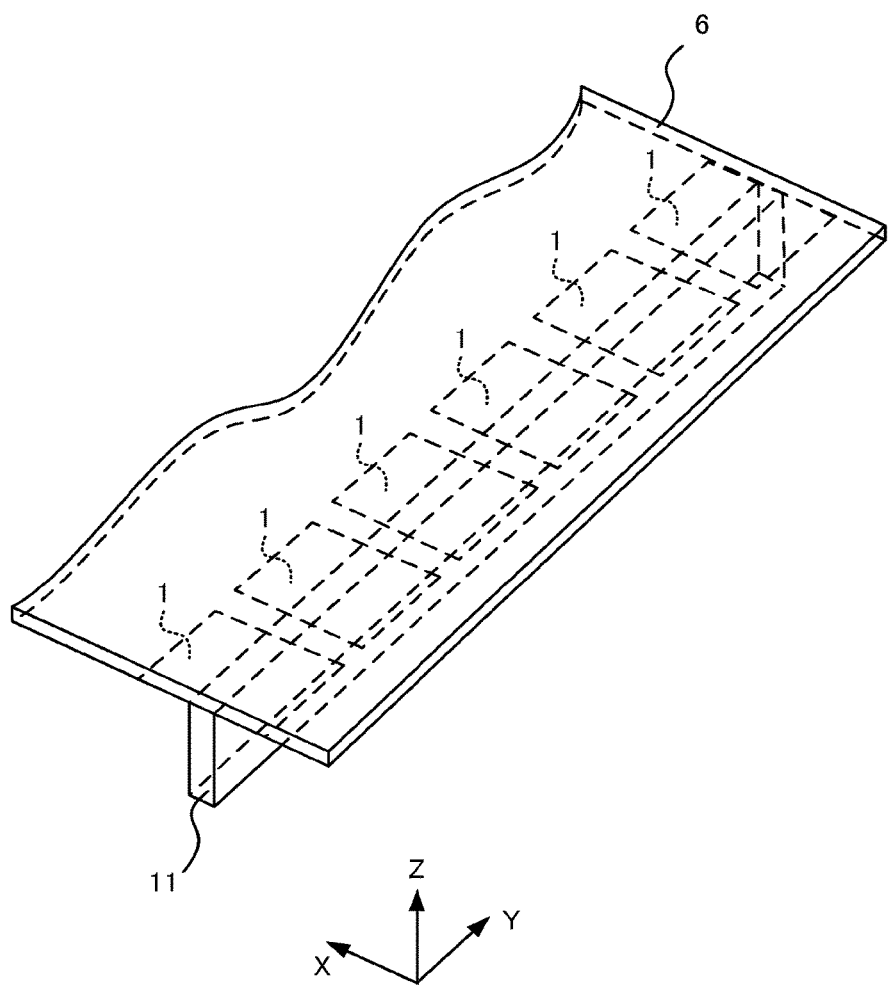
FIG. 7 is a perspective view of the main parts of the capacitance detection device according to Embodiment 1.

FIG. 7 is a perspective view illustrating main parts on the housing 13a side of the capacitance detection device according to Embodiment 1. In FIG. 7, unlike in FIG. 6, first electrodes 1 are arranged along the arrangement direction. That is, a total length of the first electrodes 1 in the arrangement direction is equal to or longer than the longitudinal-direction length or the transverse-direction length of the detection target 3. The first electrodes 1 and the first board 11 are depicted partially by dashed lines due to location on the rear side of the first plate 6, that is, on the housing 13a side. Although not illustrated, in main parts on the housing 13b side as well, second electrodes 2 are disposed along the arrangement direction. That is, a total length of the second electrodes 2 in the arrangement direction is equal to or longer than the longitudinal-direction length or the transverse-direction length of the detection target 3. When the capacitance detection device 20 has an array of first electrodes 1 and an array of second electrodes 2, the capacitance detection device 20 may have oscillator circuits and detection circuits for the respective first electrodes 1 and the respective second electrodes 2.

The first electrodes 1 arranged along the arrangement direction as illustrated in FIG. 7 and the second electrodes 2 arranged along the arrangement direction constitute a parallel-plate capacitor. As described above, the first electrode 1 may be out of line with the second electrode 2 in the transfer direction as long as the first electrode 1 and the second electrode 2 can serve as the parallel-plate capacitor. Similarly, the first electrode 1 may be out of line with the second electrode 2 in the arrangement direction. Specifically, the entirety of the multiple arranged first electrodes 1 may be out of line with the entirety of the multiple arranged second electrodes 2 in the arrangement direction and the transfer direction, or in the arrangement direction or the transfer direction. The first electrodes 1 and the second electrodes 2 that at least partially face one another on the opposite sides of the transfer path 5 may be out of line with one another in the arrangement direction and the transfer direction, or in the arrangement direction or the transfer direction.

As illustrated in FIGS. 6 and 7, the capacitance detection device 20 according to Embodiment 1 includes the first electrode(s) 1 and the second electrode(s) 2 formed along the arrangement direction, and thus the one-dimensional capacitance of the detection target 3 in the longitudinal direction or the transverse direction thereof can be detected. In addition, when the detection values of the one-dimensional capacitance is taken as a single row, a plurality of rows of one-dimensional information can be obtained since the detection target 3 is transferred. Thus two-dimensional detection values of capacitance can be eventually obtained. Thus the capacitance detection device 20 according to Embodiment 1 enables easy detection of a foreign object on the detection target 3, for example a tape attached on the detection target 3, even when the detection target 3 is banknotes as disclosed in FIG. 8 of Patent Literature 2 (Patent Literature 2: Unexamined Japanese Patent Application Kokai Publication No. 2005-10968). In other words, a region of the detection target 3 where a foreign object is attached can be identified. The above-described identification circuit has not only a capability of determining types of the transferred detection target 3 based on the change in capacitance detected by the detection circuit, but also has the following capabilities.

The identification circuit can, of course, determine that a foreign object is attached on the detection target 3 when the capacitance between the first electrode 1 and the second electrode 2 further changes while the detection target 3 of the determined type is transferred in the electric field 9. This determination is achieved by knowing in advance a change in capacitance caused by the detection target 3 for each type of the detection target 3. Thus, if a change in capacitance for each type of foreign object in a case in which the foreign object is attached on the detection target 3 is known in advance, the foreign object attached on the detection target 3 can also be identified. That is, the identification circuit can determine the type of the foreign object attached on the detection target 3. For these reasons, even when the foreign object is attached on the entire surface of the detection target 3, the identification circuit can determine, based on the change in capacitance detected by the detection circuit, that the foreign object is attached on the transferred detection target 3. Of course, the identification circuit can also determine the type of the foreign object attached on the detection target 3.

The capacitance detection device 20 according to Embodiment 1 includes the first board 11 and the second board 12, at least one of which has a main surface arranged along the electric field direction, thereby easily achieving size reduction in the transfer direction. Thus the capacitance detection device 20 can be obtained that achieves a high level of compatibility with a device or sensor for detecting information other than the change in capacitance caused by the detection target 3. That is, in a case in which increasing the capacitance in the parallel-plate capacitor is not necessary, the image reading device 40 may include the capacitance detection device 30 instead of the capacitance detection device 20. In the capacitance detection device 30, the first electrode 1b may also be out of line with the second electrode 2b in the transfer direction. Similarly, the first electrode 1b may be out of line with the second electrode 2b in the arrangement direction.

As above, the capacitance detection device 20 according to Embodiment 1 can not only precisely detect the capacitance for the detection target 3, but also has a high level of compatibility with a device or sensor for detecting information other than the change in capacitance caused by the detection target 3. Examples of the device or sensor for detecting the information other than the change in capacitance by the detection target 3 include sensors disclosed in Patent Literature 2, a roller, and an ultrasonic sensor. Patent Literature 2 discloses an image sensor for detecting a pattern on the detection target, a magnetic sensor for detecting a magnetic pattern of the detection target, and a fluorescence sensor for detecting a fluorescence image of the detection target. The fluorescence sensor may be one of functions of the image sensor.

Figure 8:
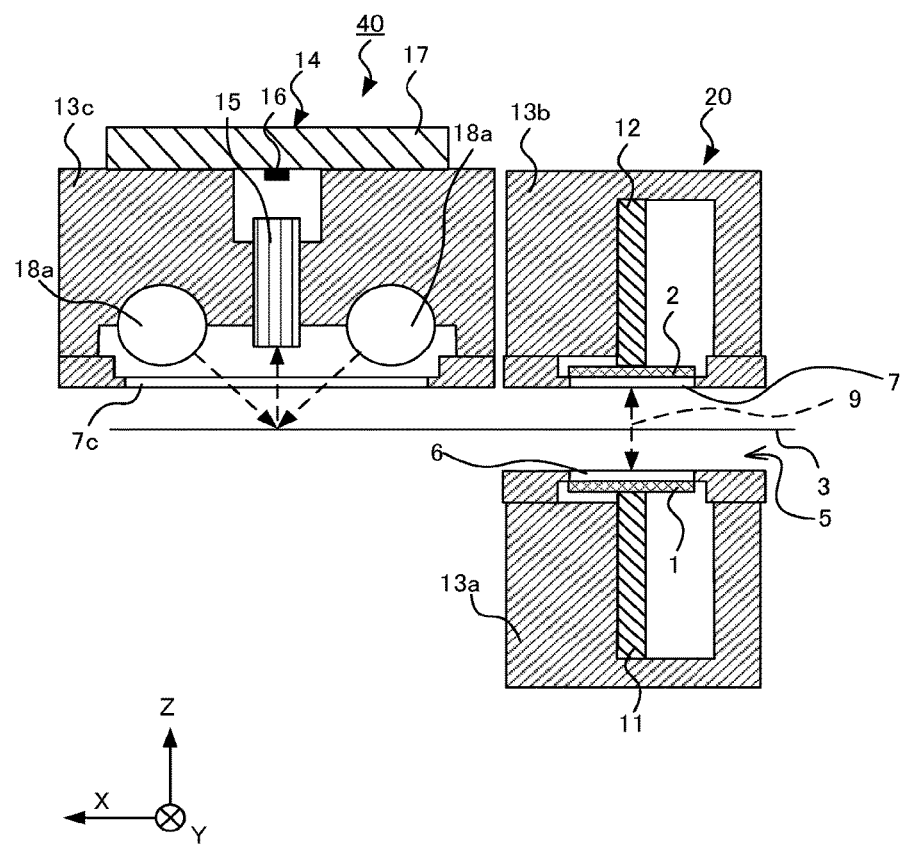
FIG. 8 is a cross-sectional view of an image reading device according to Embodiment 1, taken along a cross section defined by the transfer direction and the electric field direction.

FIG. 8 illustrates the image reading device 40 according to Embodiment 1 having the device or sensor for detecting information other than the change in capacitance caused by the detection target 3. The image reading device 40 includes an image reader 14 that reads an image of a detection target 3. The capacitance detection device 20 having the first electrode 1 and the second electrode 2 is disposed on the downstream side of the image reader 14 in the transfer direction of the transfer path 5. Although not illustrated, the first electrode 1 and the second electrode 2 may be disposed on at least one of the upstream side and the downstream side of the image reader 14 in the transfer direction of the transfer path 5.

In FIG. 8, a housing 13c is a housing of the image reading device 40 disposed on the same side as the housing 13b relative to the housing 13a and the housing 13b facing one another on the opposite sides of the transfer path 5. The housing 13c contains a lens element (imaging optical lens) 15, a sensor element (light receiving element) 16, and a light source 18a. A circuit board 17 is formed on the housing 13c on a side opposite to a housing 13c side facing the transfer path 5. The image reader 14 includes at least the sensor element 16. The image reader 14 may be a combination of the sensor element 16 and at least any of the lens element 15, the light source 18a, and the circuit board 17. The circuit board 17 may also serve as a circuit for supplying power or drive signals to the light source 18a, a light source 18b, and a light source 18c described later.

The lens element 15 in FIG. 8 focuses light from the detection target 3. The lens element 15 is an imaging optical lens. The sensor element 16 receives light focused by the lens element 15. For description of embodiments according to the present disclosure, a rod lens array of rod lenses arranged in the arrangement direction is used as the lens element 15. In addition, a multichip sensor having sensors arranged in the arrangement direction is used in the sensor element 16. Thus the arrangement direction can be referred to as a main scanning direction in the image reading device 40. The transfer direction can be referred to as the sub-scanning direction in the image reading device 40. The electric field direction can be referred to as the optical axis direction of the lens element 15 (image reader 14). Thus the main surface of the at least one of the first board 11 and the second board 12 of the capacitance detection device 20 can also be said to be disposed in parallel to the optical axis of the image reader 14.

The lens element 15 is not limited to the rod lens array and may be a microlens array. The lens element 15 is not also limited to an erecting equal magnification optical lens element such as the rod lens array or the microlens array, and may be an image reading lens element such as reduction optics. In addition, the lens element 15 may be an imaging element.

When the lens element 15 is an erecting equal magnification optical lens element, the lens element 15 is disposed in the longitudinal direction or the transverse direction of the detection target 3. That is, similarly to the first electrode 1 and the second electrode 2, the lens element 15 has a main-scanning-direction length that is equal to or longer than the longitudinal-direction length or the transverse-direction length of the detection target 3. Similarly, when the sensor element 16 is a multichip sensor, the sensor element 16 is disposed in the longitudinal direction or the transverse direction of the detection target 3. That is, similarly to the first electrode 1 and the second electrode 2, the sensor element 16 has a main-scanning-direction length that is equal to or longer than the longitudinal-direction length or the transverse-direction length of the detection target 3.

Furthermore, in FIG. 8, the circuit board 17 is a board on which the sensor element 16 is formed. The circuit board 17 performs a photoelectric conversion of light received by the sensor element 16. The circuit board 17 may have a function of a signal processing board that processes photoelectrically-converted signals. The circuit board 17 serving as the signal processing board may be formed as another board separate from the board on which the sensor element 16 is formed. The light source 18*a* that is a source of reflection light has a light guide extending in the main scanning direction. The light guide included in the light source 18*a* has a main-scanning-direction length that is equal to or longer than the longitudinal-direction length or the transverse-direction length of the detection target 3. The light source 18*a* irradiates the detection target 3 with light in a linear pattern that extends along the main scanning direction. A cover glass 7*c* is provided on the transfer path 5 side of the housing 13*c*. As indicated by dashed arrows in FIG. 8, the light emitted from the light source 18*a* is transmitted through the cover glass 7*c* and is applied to the detection target 3. As indicated by a dashed arrow in the optical axis direction in FIG. 8, the applied light is reflected on the detection target 3, and the reflection light is transmitted through the cover glass 7*c* and received through the lens element 15 by the sensor element 16. The image reading device 40 can obtain an image of the detection target 3 from the received reflection light.

The image reading device 40 according to Embodiment 1 is provided with the capacitance detection device 20 having a reduced size in the sub-scanning direction, thereby easily achieving overall size reduction. In addition, at least one of the first plate 6 and the second plate 7 of the capacitance detection device 20 according to Embodiment 1 may be made using the same material as the cover glass 7*c*, thereby achieving cost reduction. That is, the light emitted from the light source 18*a* passes through the at least one of the first plate 6 and the second plate 7 having a transmittance equal to or higher than a threshold. The threshold is defined, for example, in accordance with the amount of light emitted from the light source 18*a*.

For a simple arrangement of the first plate 6 or the second plate 7 made using the same material as the cover glass 7*c*, the first electrode 1 or the second electrode 2 may be formed by a transparent electrode. That is, at least one of sets that include a set of the first plate 6 and the first electrode 1 and a set of the second plate 7 and the second electrode 2 has a transmittance of light that is equal to or greater than the threshold, the light being emitted from the light source 18*a*. The first plate 6 and the second plate 7 may be formed by a material having the transmittance equal to or greater than a first threshold, and the first electrode and the second electrode may be formed by a material having a transmittance equal to or greater than a second threshold. The first threshold and the second threshold are defined, for example, in accordance with the amount of light emitted from the light source 18*a*. The first threshold and the second threshold may be the same value or different values.

The first plate 6 and the second plate 7 can be transparent plates formed by the same material as the cover glass 7*c*. The first electrode 1 and the second electrode 2 each can be a transparent electrode formed on the transparent plate. The transparent electrode is, for example, an indium tin oxide (ITO) film. Use of the ITO film facilitates integration of the transparent electrode and the transparent plate. The light emitted from the light source 18*a* is not limited to visible light. Whatever the transmittance of the first electrode 1, the second electrode 2, the first plate 6, and the second plate 7 for the light emitted from the light source 18*a*, the integration of the first electrode 1 and the first plate 6 and the integration of the second electrode 2 and the second plate 7 can achieve a thinner capacitance detection device 20.

Figure 9:
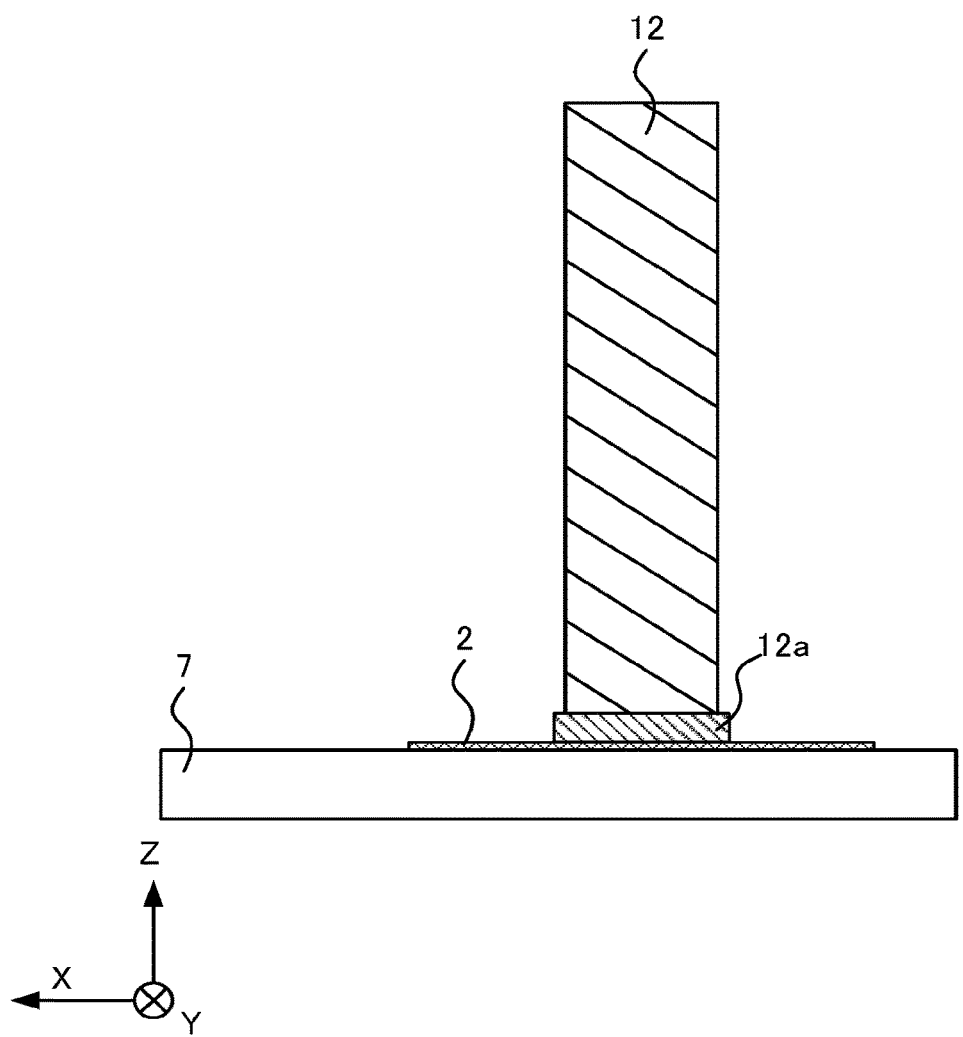
FIG. 9 is a cross-sectional view of the main parts of the capacitance detection device according to Embodiment 1, taken along a cross section defined by the transfer direction and electric field direction.

Next, a case in which the first board 11 and the first plate 6 have different coefficients of linear expansion, or the second board 12 and the second plate 7 have different coefficients of linear expansion, in the capacitance detection device 20 according to Embodiment 1 is described with reference to FIG. 9. For example, when the first plate 6 is made using the same material as the above-mentioned cover glass 7*c* and the first board 11 and the first plate 6 have greatly different coefficients of linear expansion, the difference of the coefficients of linear expansion needs to be considered. The same applies to the case in which the second board 12 and the second plate 7 have greatly different coefficients of linear expansion.

In this case, a connection between the first electrode 1 and the first board 11 may be made by an electrically conductive cushioning member disposed therebetween to maintain an electrical connection between the first board 11 and the first electrode 1 formed on the first board 11. A connection between the second electrode 2 and the second board 12 may be made by an electrically conductive cushioning member disposed therebetween to maintain an electrical connection between the second board 12 and the second electrode 2 formed on the second board 12. FIG. 9 illustrates the capacitance detection device 20 on the housing 13*b* side using a cushioning member 12*a* between the second electrode 2 and the second board 12. The capacitance detection device 20 also has the same structure on the housing 13*a* side. An electrically conductive elastic body that is a member providing cushioning, for example electrically conductive rubber, may be selected as the cushioning member. A pin connector, for example a cushioning spring formed by a phosphor-bronze plate, may be selected as the cushioning member instead of the electrically conductive rubber.

The image reading device 40 is provided with the capacitance detection device 20. In Embodiment 1, the first electrode 1 and the second electrode 2 included in the capacitance detection device 20 are disposed in the upstream side or the downstream side of the image reader 14 included in the image reading device 40 in the transfer direction of the transfer path 5. When a transparent resin tape is attached to the detection target 3 as a foreign object, the tape is less likely to appear on an image such as a reflection image or a transmission image since the tape is transparent to transmission light and reflection light. Use of a combination of capacitance detection and image reading (optical reading) is thus useful for identification of the detection target 3 on which the transparent resin tape is attached. Thus, similarly to the image reading device 40 according to Embodiment 1, arranging along the transfer direction the capacitance detection device 20 that detects capacitance and the image reader 14 that reads an image enables a pair of modules to detect a capacitance image and an optical image of the detection target 3.

Embodiment 2

An image reading device 41 according to Embodiment 2 includes a housing 13*a* and a housing 13*b* in which at least one of an oscillator circuit and a detection circuit is provided. A sensor element 16 included in an image reader 14 is provided inside a housing 13c sealed with at least one of a first plate 6 and a second plate 7. The image reader 14 reads an image (image information) of a detection target 3.

Figure 10:
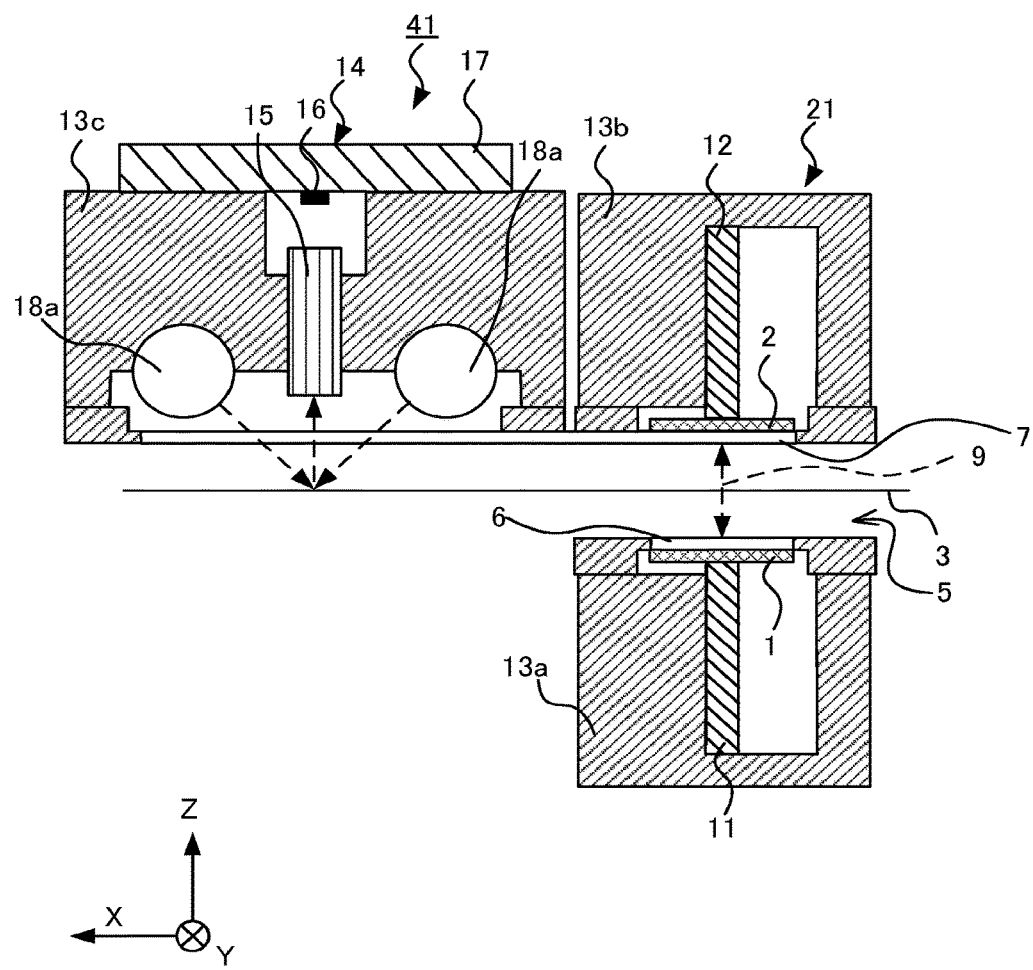
FIG. 10 is a cross-sectional view of an image reading device according to Embodiment 2 of the present disclosure, taken along a cross section defined by the transfer direction and the electric field direction.

A main structure of a capacitance detection device 21 according to Embodiment 2 is described with reference to FIGS. 10 to 24. The structure of the capacitance detection device 21 is described below that is a more preferable structure for the image reading device 41 in which a device or sensor for detecting information other than a change in capacitance caused by the detection target 3 detects an image, a watermark or the like printed on the detection target 3. The first plate 6 and the second plate 7 are transparent plates that can be used as a cover glass 7c with which the housing 13c of the image reading device 40 according to Embodiment 1 is sealed. A first electrode 1 and a second electrode 2 are transparent electrodes that are formed on the cover glass 7c. As illustrated in FIG. 8, the cover glass 7c of the housing 13c and the second plate 7 of the housing 13b are different members in the image reading device 40 having a capacitance detection device 20. As illustrated in FIG. 10, the image reading device 41 having the capacitance detection device 21 differs from the image reading device 40 illustrated in FIG. 8 in that the second plate 7 seals the housing 13c and is a transparent plate. The second plate 7 has a transmittance of light that is equal to or greater than a threshold, the light being emitted from a light source 18a. In FIG. 10, the first plate 6 may be a plate other than a transparent plate. Even when the first plate 6 blocks light emitted from light sources 18a, 18b, and 18c, the first plate 6 need not be a transparent plate as long as the image reader 14 described later does not have difficulty in performing reading. The light emitted from the light sources 18a, 18b, and 18c is not limited to visible light.

In FIGS. 10 to 24, the image reader 14 has at least the sensor element 16. A lens element 15 focuses, via at least one of the first plate 6 and the second plate 7, light reflected on the detection target 3 or light transmitted through the detection target 3. The sensor element 16 receives light focused by the lens element 15. The light sources 18a, 18b, and 18c emit light to the detection target 3. The light that the lens element 15 focuses is light that is emitted from the light sources 18a and 18b onto the detection target 3 and reflected on the detection target 3 or light that is emitted from the light sources 18b and 18c onto the detection target 3 and transmitted through the detection target 3. The light sources 18a, 18b, and 18c are each disposed on a side opposite to the transfer path 5 relative to the first plate 6 or the second plate 7. That is, the light sources 18a, 18b, and 18c are included in any of the housings 13a, 13b, and 13c.

Figure 11:
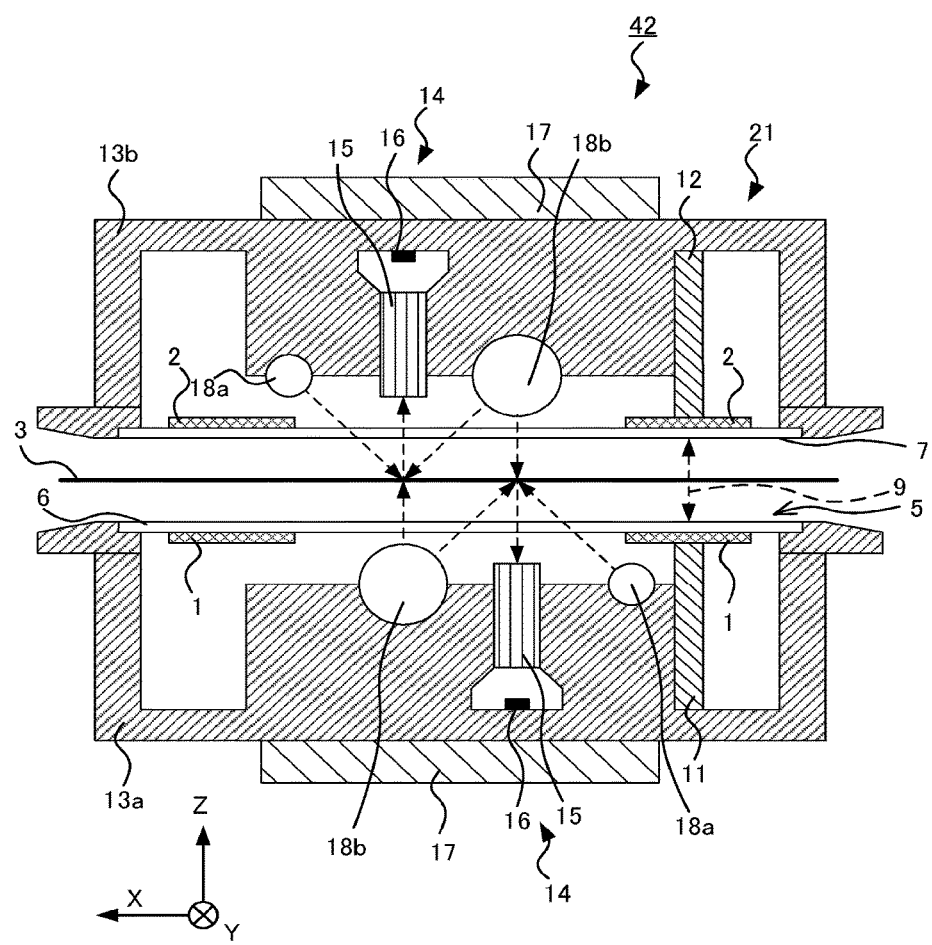
FIG. 11 is a cross-sectional view of a first variation of the image reading device according to Embodiment 2, taken along a cross section defined by the transfer direction and the electric field direction.

An image reading device 42 illustrated in FIG. 11 is a combination of the housing 13a of the capacitance detection device 21 integrated with the housing 13c of the image reading device 41 illustrated in FIG. 10 and the housing 13b of the capacitance detection device 21 integrated with the housing 13c of the image reading device 41 illustrated in FIG. 10. Specifically, the housing 13b illustrated in FIG. 11 is an integrated structure of the housing 13b and housing 13c that are illustrated in FIG. 10. The housing 13b has tapered inclined ends on the upstream and downstream sides in the transfer direction in the transfer path 5, thereby reducing a possibility that the detection target 3 is caught at the ends when transferred. In FIG. 11, the external appearance of the housing 13a and the image reader 14 included in the housing 13a are the same as the external appearance of the housing 13b and the image reader 14 included in the housing 13b. The image readers 14, however, are partially different in structure. The image reading device 42 illustrated in FIG. 11 can thus read both images on surfaces of the detection target 3, that is, a front surface facing the housing 13b and a back surface facing the housing 13a. The housing 13a includes the light source 18a disposed on the upstream side in the transfer direction and the light source 18b disposed on the downstream side. The light source 18b is a light source for reflection light and transmission light. The housing 13b includes the light source 18b disposed on the upstream side in the transfer direction and the light source 18a disposed on the downstream side. The light source 18b has a light guide extending in the main scanning direction. The main-scanning-direction length of the light guide included in the light source 18b is equal to or longer than the longitudinal-direction length or the transverse-direction length of the detection target 3.

As indicated by dashed arrows inclined to the optical axis direction in FIG. 11, the detection target 3 is irradiated with light from the light source 18a and the light source 18b. As indicated by dashed arrows along the optical axis direction in FIG. 11, the emitted light is reflected on the detection target 3, and the reflected light is transmitted through the first plate 6 or the second plate 7 that is a cover glass, and is received through the lens element 15 by the sensor element 16. As indicated by dashed arrows along the optical axis direction in FIG. 11, the detection target 3 is irradiated with light from the light source 18b. As indicated dashed arrows along the optical axis direction in FIG. 11, the emitted light is transmitted through the detection target 3, and the transmitted light is transmitted through the first plate 6 or the second plate 7 and is received through the lens element 15 by the sensor element 16.

As described in Embodiment 1, the light source 18a irradiates the detection target 3 with light in a linear pattern extending along the main scanning direction. The light source 18a irradiates the detection target 3 with a row of light obliquely to the transfer direction and the optical axis direction. In contrast, the light source 18b irradiates the detection target 3 with two rows of light in a linear pattern along the main scanning direction. The first row of light in the linear pattern is emitted from the light source 18b obliquely to the transfer direction and the optical axis direction, similarly to the light emitted from the light source 18a. The second row of light in the linear pattern is emitted in parallel to the optical axis direction. Alignment of the optical axis of the emitted light of the light source 18b and the optical axis of the lens element 15 causes the light emitted parallel to the optical axis direction to be transmitted through the detection target 3 and received through the lens element 15 by the sensor element 16. Specifically, the optical axis of the light source 18b on the housing 13a side aligns with the optical axis of the lens element 15 on the housing 13b side, and the optical axis of the light source 18b on the housing 13b side aligns with the optical axis of the lens element 15 on the housing 13a side. The image reading device 42 illustrated in FIG. 11 includes the image reader 14 that is also capable of reading an image of a watermark of the detection target 3.

Figure 12:
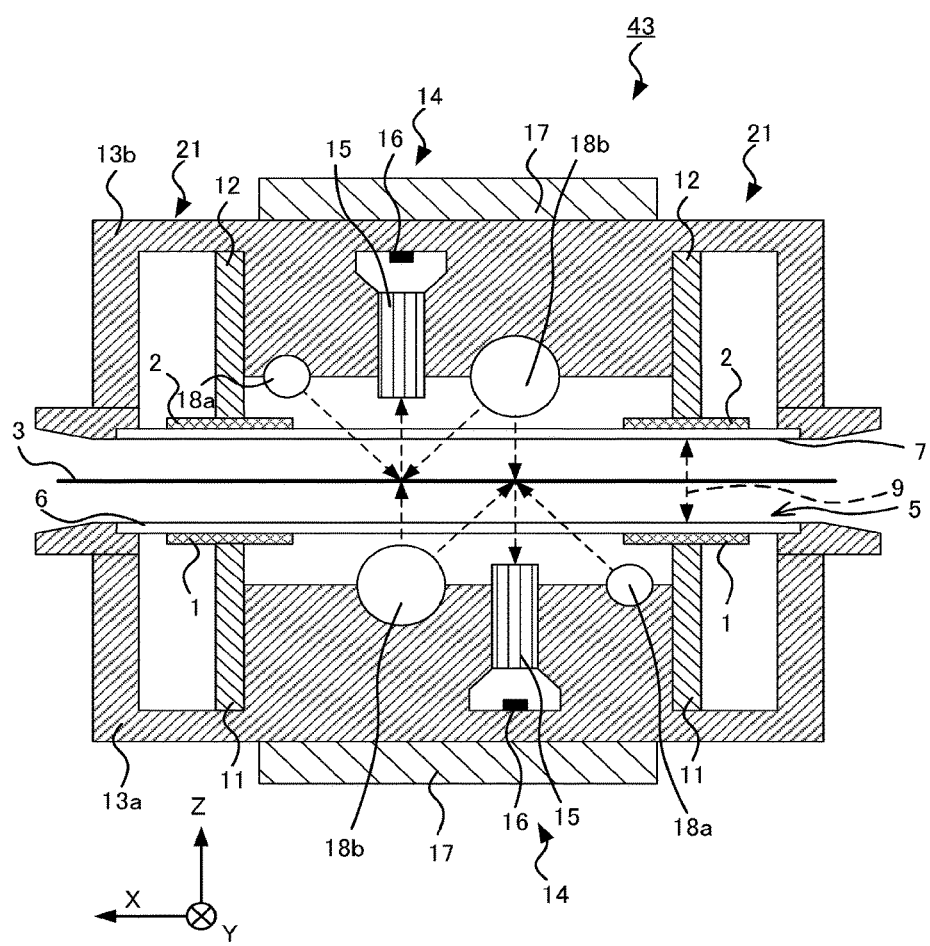
FIG. 12 is a cross-sectional view illustrating a second variation of the image reading device according to Embodiment 2, taken along a cross section defined by the transfer direction and the electric field direction.

The image reading device 42 illustrated in FIG. 11 further includes, on the downstream side in the transfer direction, the first plate 6 and the second plate 7 on which the first electrode 1 and the second electrode 2 are respectively formed. Thus removal of the first board 11 and the second board 12 on the upstream side in the transfer direction and attachment of the boards on the downstream side enable the capacitance detection device 21 to be arranged on the downstream side in the transfer direction. As in an image reading device 43 illustrated in FIG. 12, the first board 11 and the second board 12 may be formed on the downstream side in addition to the upstream side in the transfer direction. Detailed description of the image reading device 43 illustrated in FIG. 12 is omitted since the difference between the image reading device 42 illustrated in FIG. 11 and the image reading device 43 illustrated in FIG. 12 is only the first board 11 and the second board 12 formed on the downstream side in the transfer direction. Similarly in FIG. 13 and the subsequent figures, a capacitance detection device 22 described later is arranged on at least one of the upstream side and the downstream side in the transfer direction.

In the image reading device 43 illustrated in FIG. 12, a change in capacitance caused by the detection target 3 transferred in the transfer path 5 can be detected by either or both of the capacitance detection devices 21 on the upstream side and the downstream side. When a signal or image data indicating a detection value of the capacitance that is detected at either of the capacitance detection devices 21 on the upstream side and the downstream side is passed to an upper level system, connection of a signal line or the like may be switched to the upstream side or the downstream side.

Figure 13:
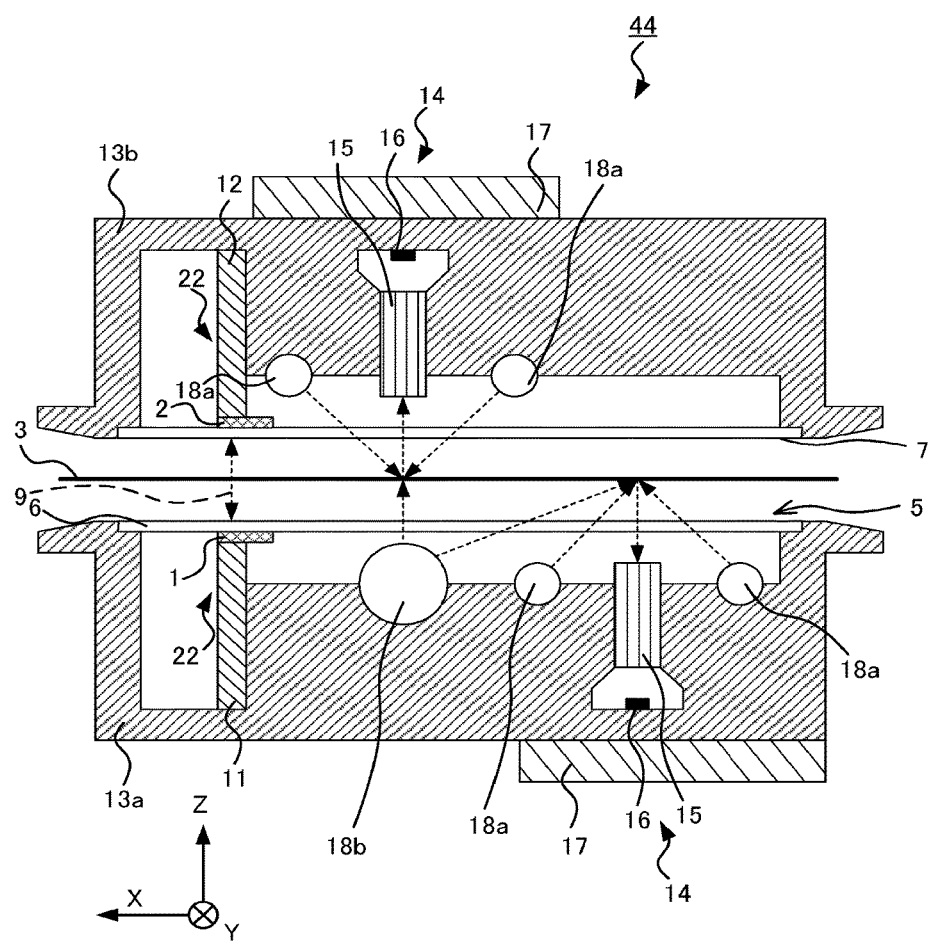
FIG. 13 is a cross-sectional view of a third variation of the image reading device according to Embodiment 2, taken along a cross section defined by the transfer direction and the electric field direction.

In an image reading device 44 illustrated in FIG. 13, the light source 18b is provided only on the housing 13a side. The image reading device 44 is used when reading an image of a watermark on the detection target 3 only by one of the image readers 14 is sufficient. The image reading device 44 may include, instead of the light source 18b, a light source 18c described later that is a light source for transmission light. The light source 18c has a light guide extending in the main scanning direction. The main-scanning-direction length of the light guide included in the light source 18c is equal to or longer than the longitudinal-direction length or the transverse-direction length of the detection target 3. When the image reading device 44 includes the light source 18b, the light source 18a between the light source 18b and the lens element 15 need not be provided inside the housing 13a.

In the image reading device 44 illustrated in FIG. 13, the first electrode 1 extends along the transfer direction, and is electrically connected to the first board 11 via connection wiring (connection electrode) at a portion near the end of the first electrode 1 that is on the opposite side relative to the optical axis of the lens element 15 adjacent to the first electrode 1 in the transfer direction. That is, the first electrode 1 is electrically connected to the first board 11 via the connection wiring at a portion of the first electrode 1 that is farther away from the optical axis of the image reader 14 than the center of the first electrode 1 in the transfer direction. Similarly, the second electrode 2 extends along the transfer direction, and is electrically connected to the second board 12 via the connection wiring (connection electrode) at a portion near the end of the second electrode 2 that is on the opposite side relative to the optical axis of the lens element 15 adjacent to the second electrode 2 in the transfer direction. That is, the second electrode 2 is electrically connected to the second board 12 via the connection wiring at a portion of the second electrode 2 that is farther away from the optical axis of the image reader 14 than the center of the second electrode 2 in the transfer direction. Such arrangement facilitates arranging the capacitance detection device 22 closer to the image reader 14. This is achieved because arranging the first electrode 1 closer to the image reader 14 without arranging the first board 11 closer to the image reader 14 is easy to achieve, and arranging the second electrode 2 closer to the image reader 14 without arranging the second board 12 closer to the image reader 14 is easy to achieve. The first electrode 1 and the second electrode 2 illustrated in FIG. 13 and the subsequent figures have the similar shapes.

Figure 14:
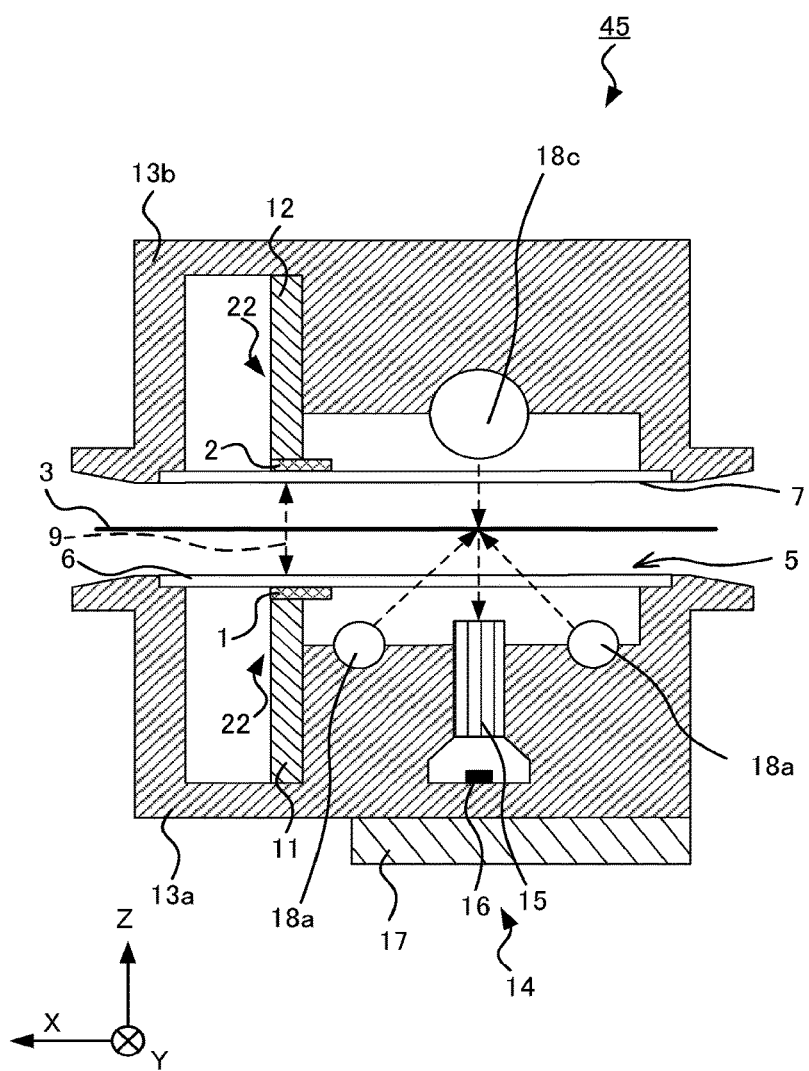
FIG. 14 is a cross-sectional view of a fourth variation of the image reading device according to Embodiment 2, taken along a cross section defined by the transfer direction and the electric field direction.

An image reading device 45 illustrated in FIG. 14 is provided with the image reader 14 only on the housing 13a side. The light source 18c that is the above-mentioned light source for transmission light is provided inside the housing 13b of the image reading device 45 when reading an image of a watermark on the detection target 3 only by one image reader 14 is sufficient and reading the image only on one side of the detection target 3 is sufficient. The light source 18c is different from the light source 18b, and irradiates the detection target 3 with a row of light in the linear pattern along the main scanning direction. The light source 18c emits light in parallel to the optical axis direction. Alignment of the optical axis of the emitted light of the light source 18c and the optical axis of the lens element 15 causes the light emitted in parallel to the optical axis direction to be transmitted via the second plate 7 through the detection target 3 and received via the lens element 15 by the sensor element 16. Specifically, the optical axis of the light source 18c on the housing 13b side aligns with the optical axis of the lens element 15 on the housing 13a side. The light source 18b can be said to be a combination of the light source 18a and the light source 18c.

Figure 15:
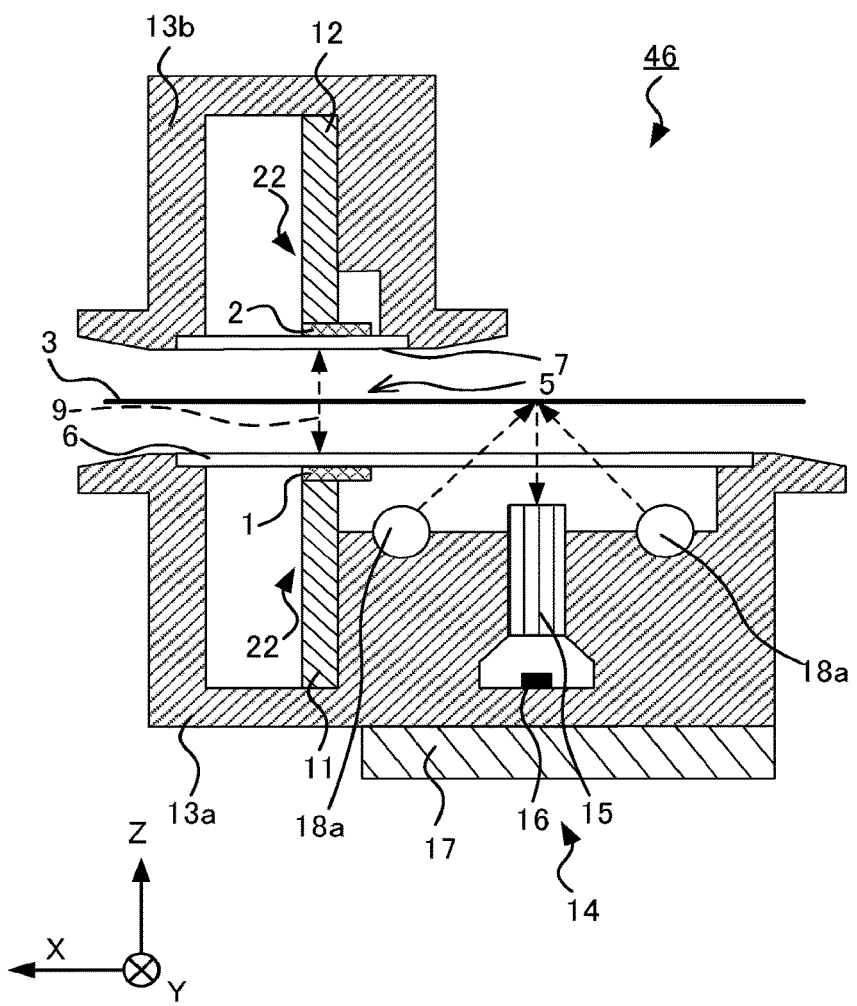
FIG. 15 is a cross-sectional view of a fifth variation of the image reading device according to Embodiment 2, taken along a cross section defined by the transfer direction and the electric field direction.

An image reading device 46 illustrated in FIG. 15 has a structure in which the light source 18c is removed from the housing 13b of the image reading device 45 illustrated in FIG. 14. The image reading device 46 cannot read the image of the watermark on the detection target 3, but the omission of the light source 18c can achieve size reduction. The image reading device 46 illustrated in FIG. 15 can be said to have a structure in which the transfer direction of the image reading device 41 illustrated in FIG. 10 is reversed.

Figure 16:
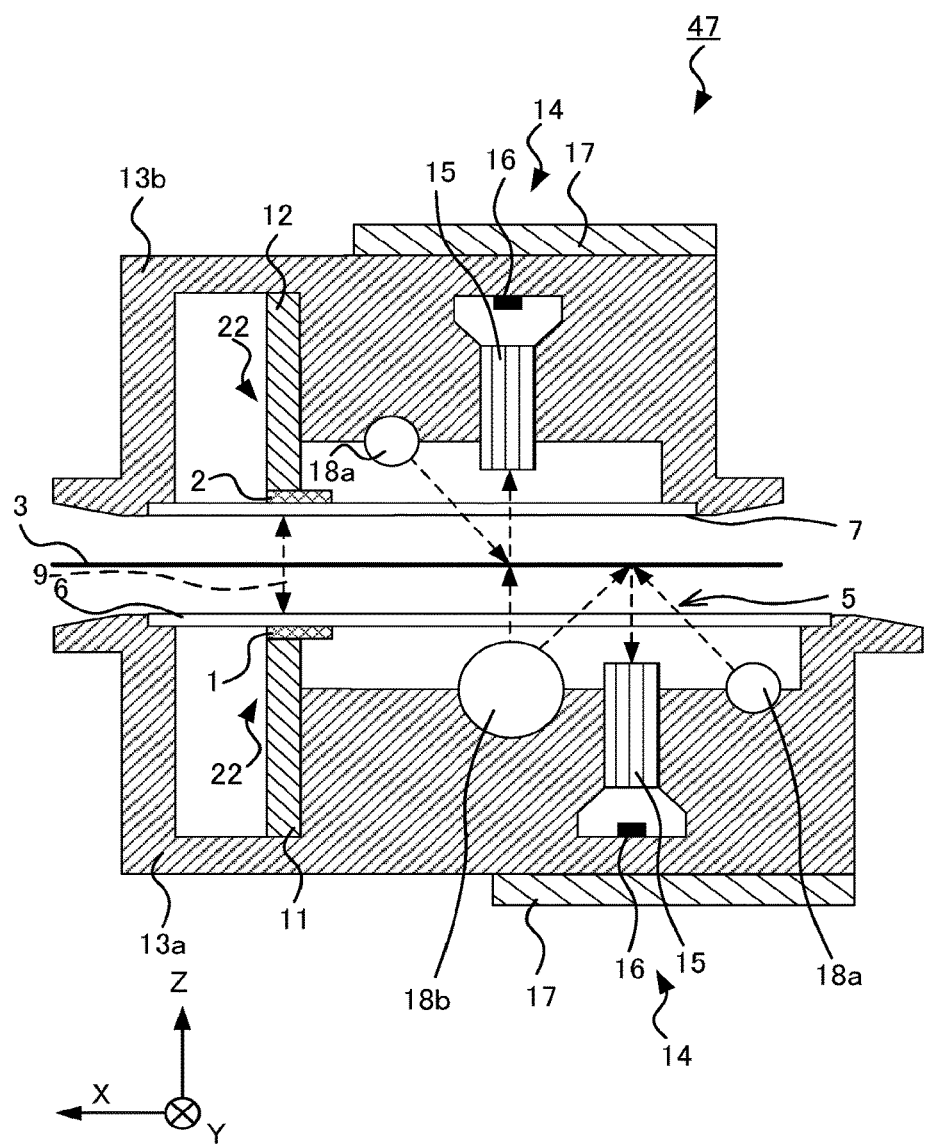
FIG. 16 is a cross-sectional view of a sixth variation of the image reading device according to Embodiment 2, taken along a cross section defined by the transfer direction and the electric field direction.
Figure 17:
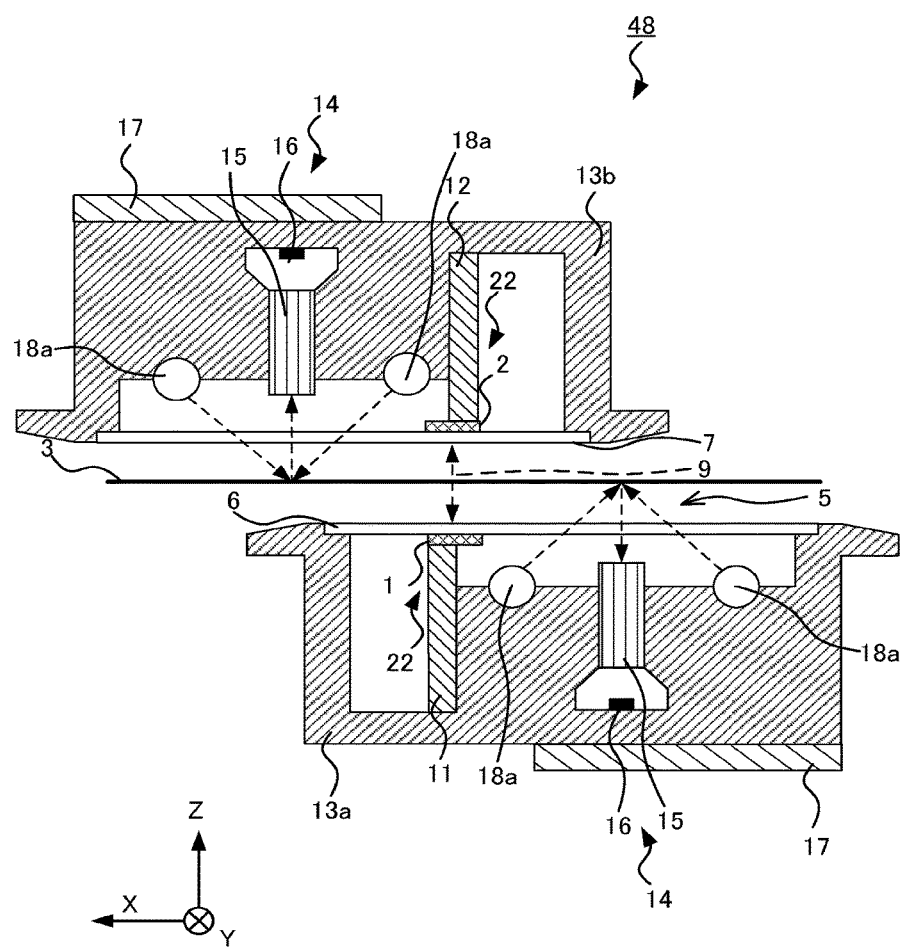
FIG. 17 is a cross-sectional view of a seventh variation of the image reading device according to Embodiment 2, taken along a cross section defined by the transfer direction and the electric field direction.

An image reading device 47 illustrated in FIG. 16 has a structure in which the light source 18a and the light source 18b on the housing 13a side of the image reading device 44 illustrated in FIG. 13 are integrated into the light source 18b. Furthermore, the image reading device 47 illustrated in FIG. 16 can have a reduced size because the housing 13a and the housing 13b each contain a single light source 18a. In an image reading device 48 illustrated in FIG. 17, the capacitance detection devices 22 are disposed on the downstream side of the image reader 14 of the housing 13a in the transfer direction and on the upstream side of the image reader 14 of the housing 13b in the transfer direction. The first electrode 1 disposed on the housing 13a side is electrically connected to the first board 11 via the connection wiring at a portion of the first electrode 1 that is farther away from the lens element 15 adjacent to the first electrode 1 in the transfer direction than the center of the first electrode 1 in the transfer direction, that is, at the portion that is farther away from the lens element 15 disposed on the upstream side in the transfer direction. The second electrode 2 disposed on the housing 13b side is electrically connected to the second board 12 via the connection wiring at a portion of the second electrode 2 that is farther away from the lens element 15 adjacent to the second electrode 2 in the transfer direction than the center of the second electrode 2 in the transfer direction, that is, at the portion that is farther away from the lens element 15 disposed on the downstream side in the transfer direction.

FIGS. 18 to 22 illustrate image reading devices 49, 50, 51, 52, and 53 in which a portion of the first electrode 1 or the second electrode 2 overlaps the light source 18a in the optical axis direction. The image reading devices 49, 50, 51, 52, and 53 illustrated in FIGS. 18 to 22 do not have tapered inclined ends on the upstream and downstream sides of the housing 13a and the housing 13b in the transfer direction. The ends on the upstream and downstream sides of the housing 13a and the housing 13b in the transfer direction, however, may be tapered inclined ends.

In the image reading devices 49, 50, 51, and 52 illustrated in FIGS. 18 to 21, a portion of the second electrode 2 overlaps, in the optical axis direction, the light source 18a on the downstream side of the housing 13b in the transfer direction. In the image reading device 53 illustrated in FIG. 22, a portion of the first electrode 1 overlaps, in the optical axis direction, the light source 18a on the upstream side of the housing 13a in the transfer direction. In addition, the second electrode 2 overlaps, in the optical axis direction, the light source 18a on the downstream side of the housing 13b in the transfer direction.

Although in the image reading devices 49, 50, 51, 52, and 53 illustrated in FIGS. 18 to 22, a portion of the first electrode 1 or the second electrode 2 overlaps the light source 18a, this overlap is unlikely to result in blocking of light transmission from the light source 18a to the detection target 3 because the first electrode 1 or the second electrode 2 is a transparent electrode. This means that when an amount of light from the light sources 18a, 18b, and 18c is not reduced or a necessary amount of light is ensured, the first electrode 1 or the second electrode 2 need not be transparent. That is, the first electrode 1 or the second electrode 2 need not be transparent as long as the first electrode 1 and the second electrode 2 are located to avoid the optical axis of light emitted toward the detection target 3 from the light sources 18a, 18b, and 18c that irradiate the detection target 3 with light and the optical axis of the image reader 14 (lens element 15). The first electrode 1 and the second electrode 2 need not be transparent, for example, when the first electrode 1 and the second electrode 2 are located not to block the optical path from the light sources 18a, 18b, and 18c to the detection target 3 and the optical path from the detection target 3 to the image reader 14. Even when the first electrode 1 or the second electrode 2 blocks light emitted from the light sources 18a, 18b, and 18c, the first electrode or the second electrode need not be a transparent electrode as long as the image reader 14 does not have difficulty in performing reading. The light here is not limited to visible light.

Similarly to the image reading devices 49, 50, 51, 52, and 53 illustrated in FIGS. 18 to 22, in the image reading devices 42, 43, and 44 illustrated in FIGS. 11, 12, and 13, a portion of the first electrode 1 or the second electrode 2 can also be said to overlap the light source 18a although the first electrode 1 or the second electrode 2 is distant from the light source 18a in the optical axis direction. Use of a transparent electrode as the first electrode 1 or the second electrode 2 in the image reading devices 42, 43, 44 illustrated in FIGS. 11, 12, and 13 is also unlikely to result in blocking of light transmission from the light source 18a to the detection target 3.

Figure 18:
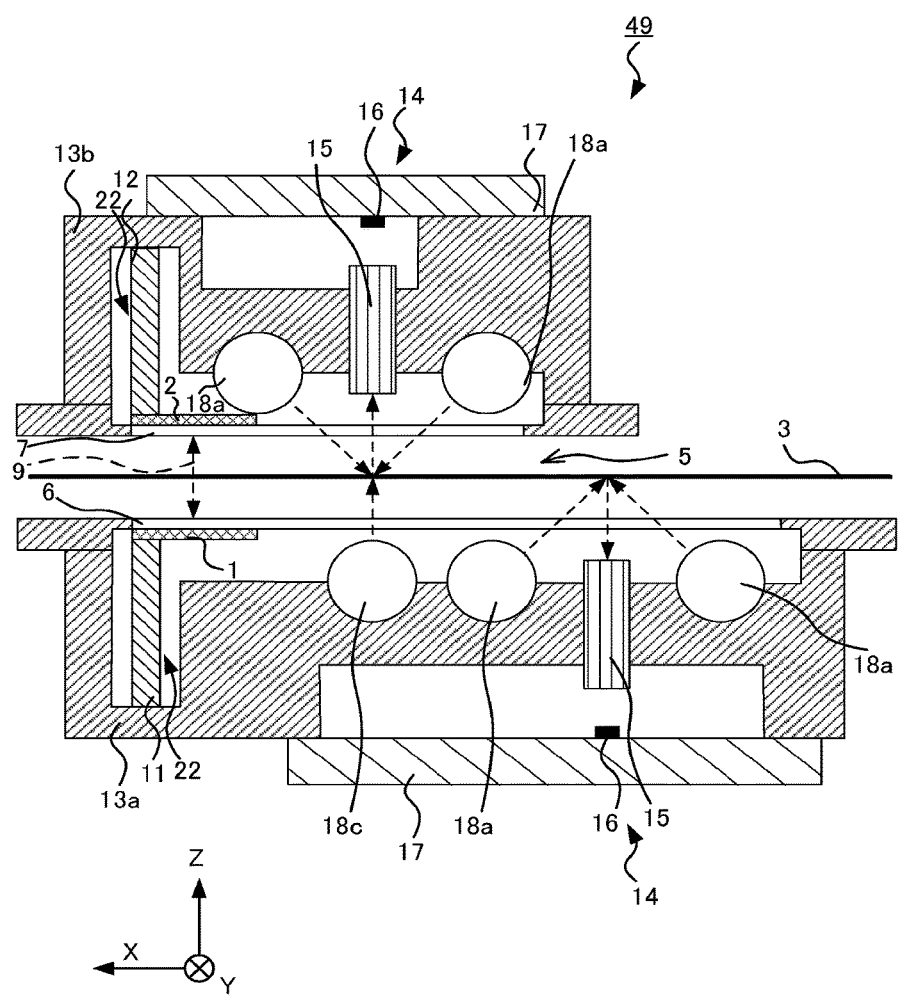
FIG. 18 is a cross-sectional view of an eighth variation of the image reading device according to Embodiment 2, taken along a cross section defined by the transfer direction and the electric field direction.
Figure 19:
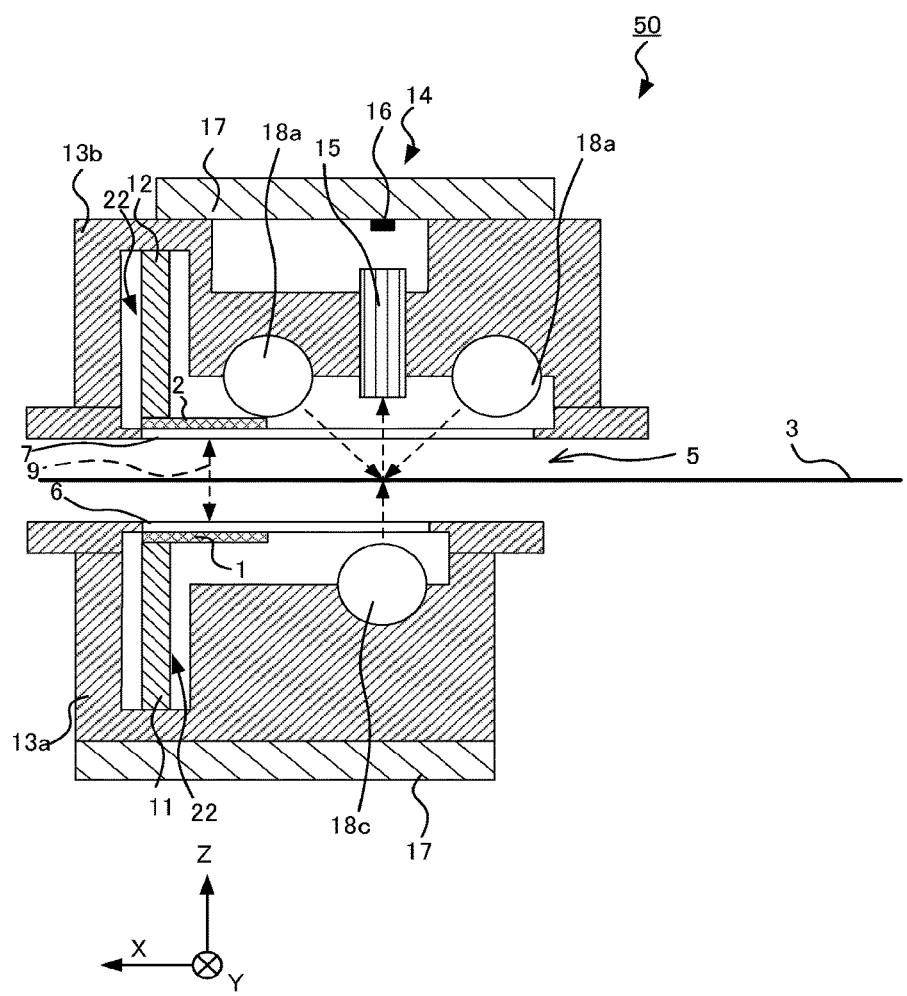
FIG. 19 is a cross-sectional view of a ninth variation of the image reading device according to Embodiment 2, taken along a cross section defined by the transfer direction and the electric field direction.
Figure 20:
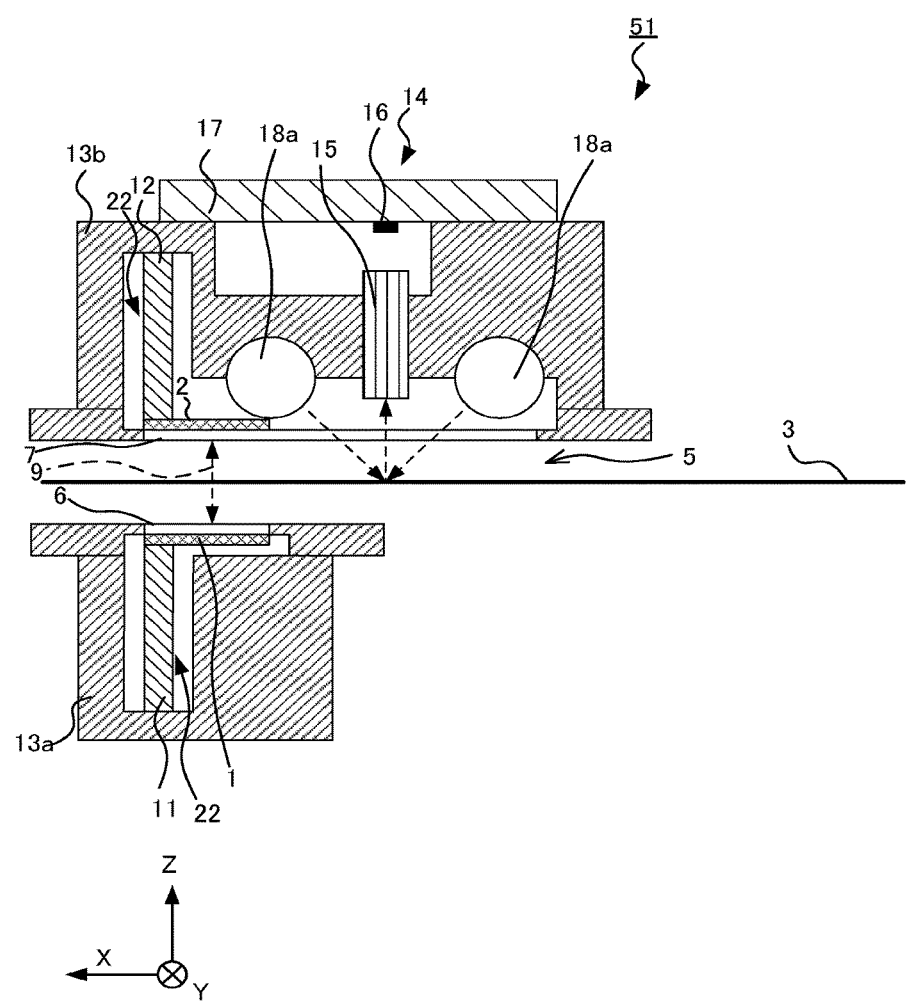
FIG. 20 is a cross-sectional view of a tenth variation of the image reading device according to Embodiment 2, taken along a cross section defined by the transfer direction and the electric field direction.
Figure 21:
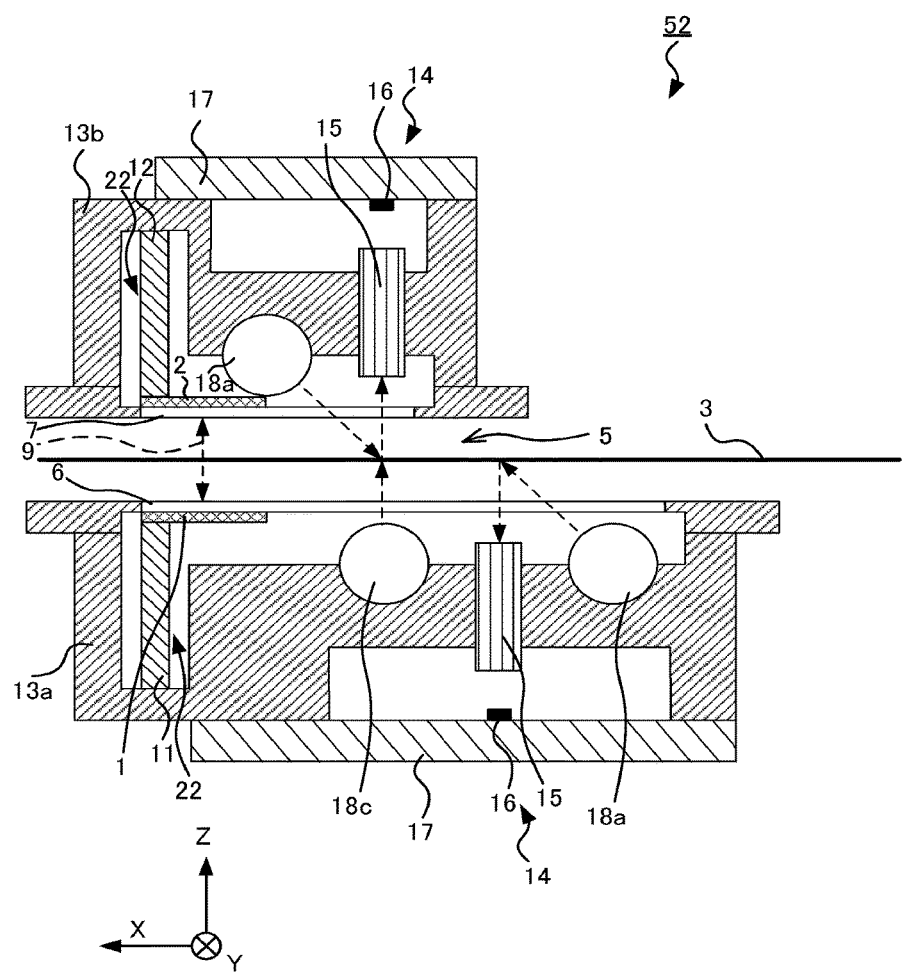
FIG. 21 is a cross-sectional view of an eleventh variation of the image reading device according to Embodiment 2, taken along a cross section defined by the transfer direction and the electric field direction.

The image reading device 49 illustrated in FIG. 18 has a structure similar to the image reading device 44 illustrated in FIG. 13. The image reading device 50 illustrated in FIG. 19 has a structure similar to the image reading device 45 illustrated in FIG. 14. Specifically, the image reading device 50 is similar to the structure with the housing 13a and the housing 13b of the image reading device 45 inverted upside-down in the optical axis direction. The image reading device 51 illustrated in FIG. 20 has a structure similar to the image reading device 46 illustrated in FIG. 15. Specifically, the image reading device 51 is similar to the structure with the housing 13a and the housing 13b of the image reading device 46 inverted upside-down in the optical axis direction. The image reading device 52 illustrated in FIG. 21 has a structure similar to the image reading device 47 illustrated in FIG. 16. The image reading device 53 illustrated in FIG. 22 has a structure similar to the image reading device 48 illustrated in FIG. 17.

Figure 22:
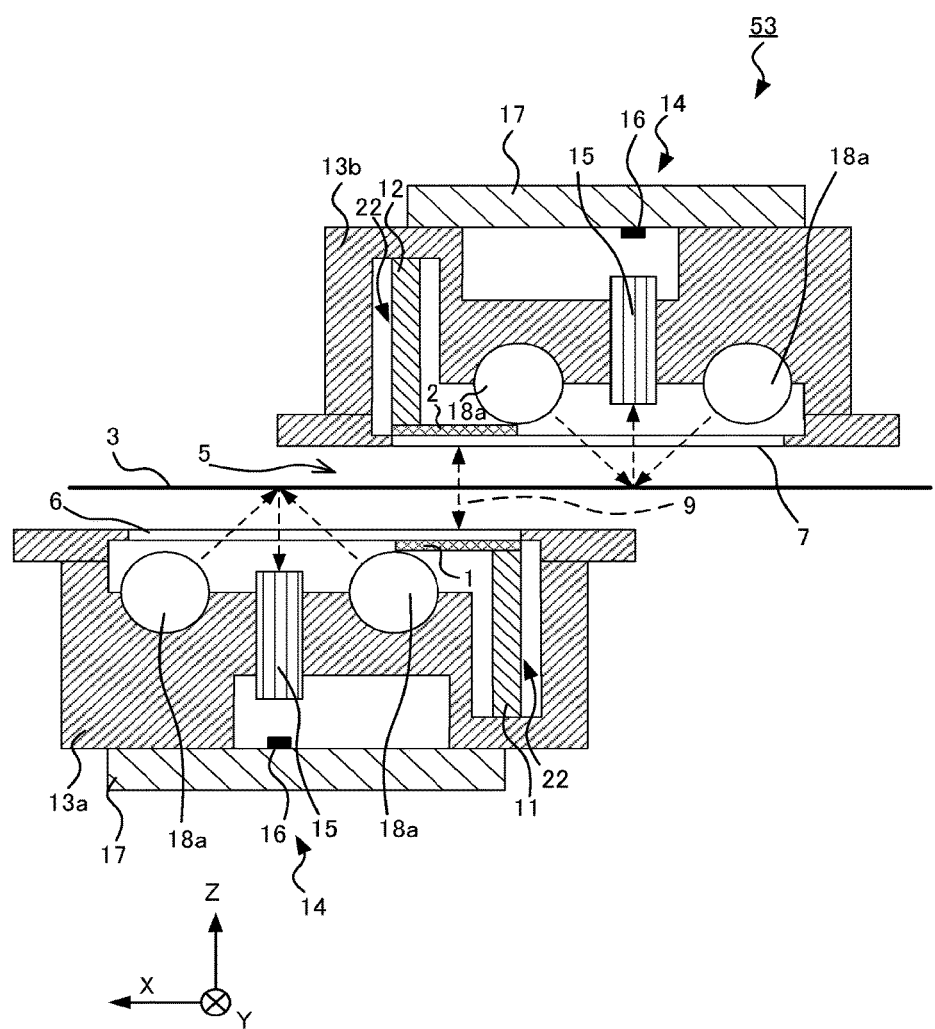
FIG. 22 is a cross-sectional view illustrating a twelfth variation of the image reading device according to Embodiment 2, taken along a cross section defined by the transfer direction and the electric field direction.
Figure 24:
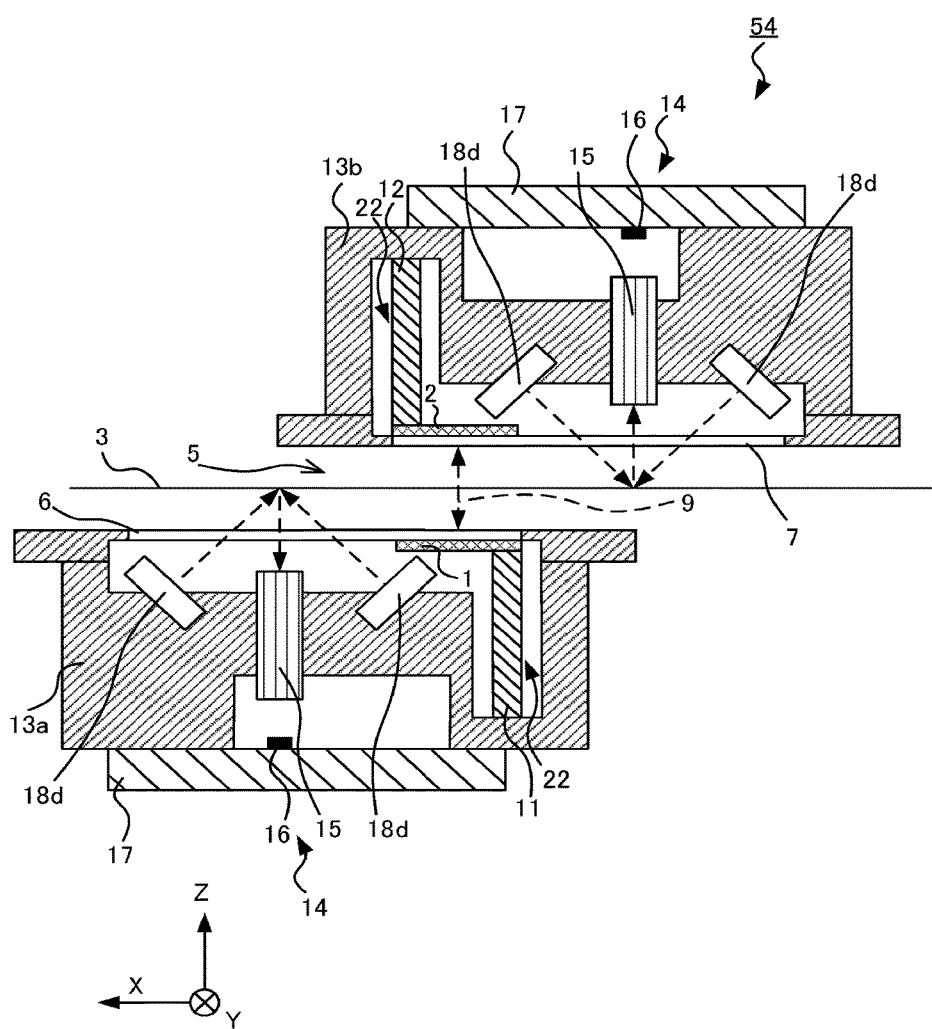
FIG. 24 is a cross-sectional view of the image reading devices according to Embodiments 1 and 2, taken along a cross section defined by the transfer direction and the electric field direction.

In the image reading device 53 illustrated in FIG. 22 and an image reading device 54 illustrated in FIG. 24 are described later, the first board 11 and the second board 12 each have a main surface parallel to the optical axis direction. In FIGS. 22 and 24, the first board 11 is disposed out of line with the second board 12 in the sub-scanning direction. Thus, the first board 11 may be out of line with the second board 12 in the sub-scanning direction. Such out-of-line arrangement in the sub-scanning direction can also be applied to the other image reading devices (capacitance detection devices) according to Embodiments 1 and 2. In FIGS. 22 and 24, the board disposed in parallel to the optical axis direction may be either one of the first board 11 and the second board 12.

Figure 23:
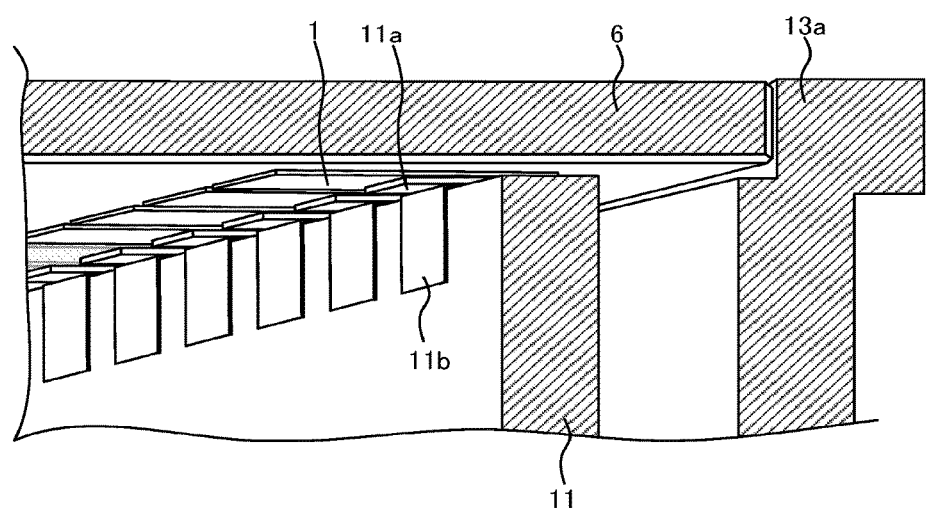
FIG. 23 is an enlarged view illustrating, in an enlarged manner, portions of electrical connection between first electrodes and first boards of the image reading devices according to Embodiments 1 and 2.

An electrical connection between the first board 11 and the first electrode 1 and an electrical connection between the second board 12 and the second electrode 2 are described in detail using as an example the image reading device 53 illustrated in FIG. 22. FIG. 23 is a view illustrating, in an enlarged manner, the housing 13a and portions of electrical connection between the first electrodes 1 and the first boards 11 of the image reading device 53 illustrated in FIG. 22. In FIG. 23, illustration of a portion of the housing 13a and the light source 18a is omitted. In FIG. 23, the first board 11 has a main surface that is parallel to the optical axis of the image reader 14. The first board 11 is electrically connected to the first electrode 1 via side wiring (connection wiring) 11b formed on the side surface of the first board 11 facing the first electrode 1 in the electric field direction. In the example of FIG. 23, the side wiring 11b extends along the main surface of the first board 11 from the side surface of the first board 11 facing the first electrode 1. As illustrated, an electrically conductive cushioning member 11a may be provided between the first electrode 1 and the side wiring 11b. Similarly, the second board 12 has a main surface parallel to the optical axis of the image reader 14. The second board 12 is electrically connected to the second electrode 2 via side wiring 12b formed on the side surface of the second board 12 facing the second electrode 2 in the electric field direction. An electrically conductive cushioning member 12a may be provided between the second electrode 2 and the side wiring 12b. The side wiring 11b may be formed by a conductive pattern (side electrode) formed on the side surface of the first board 11. Similarly, the side wiring 12b formed on the side surface of the second board 12 is a conductive pattern formed on the side surface of the second board 12. The side surface of the first board 11 and the side surface of the second board 12 refer to surfaces on the transfer path 5 side among the side surfaces of the first board 11 and the second board 12 that are parallel to the transfer direction.

Specifically, in the image reading devices 40 to 53 according to Embodiments 1 and 2, the side wiring 11b is an L-shaped conductive pattern (electrode) extending from the side surface of the first board 11 to the main surface of the first board 11 that is parallel to the optical axis direction. On the surface of the first board 11 that is parallel to the optical axis direction, the side wiring 11b is electrically connected to at least one of the oscillator circuit and the detection circuit. Similarly, the side wiring 12b is an L-shaped conductive pattern extending from the side surface of the second board 12 to the main surface of the second board 12 that is parallel to the optical axis direction. On the surface of the second board 12 that is parallel to the optical axis direction, the side wiring 12b is electrically connected to at least one of the oscillator circuit and the detection circuit. As described above, the side surface of the first board 11 and the side surface of the second board 12 refer to surfaces on the transfer path 5 side among the side surfaces of the first board 11 and the second board 12 that are parallel to the transfer direction.

More detailed description on FIG. 23 is provided. The first electrodes 1 extend along the transfer direction. Each first electrode 1 is electrically connected to the first board 11 via the corresponding side wiring 11b at a portion of the first electrode 1 that is farther away from the optical axis of the lens element 15 adjacent to the first electrode 1 in the transfer direction than the center of the first electrode 1 in the transfer direction. Similarly, the second electrodes 2 extend along the transfer direction, and each second electrode 2 is electrically connected to the second board 12 via the corresponding side wiring 12b at a portion of the second electrode 2 that is farther away from the optical axis of the lens element 15 adjacent to the second electrode 2 in the transfer direction than the center of the second electrode 2 in the transfer direction. Here again, the electrically conductive cushioning member 11a may be disposed between the first electrode 1 and the side wiring 11b. Of course, the first board 11 may be electrically connected to the first electrode 1 via the side wiring 11b at a central portion of the first electrode 1 in the transfer direction or at a portion of the first electrode 1 that is closer to the optical axis of the lens element 15 adjacent to the first electrode 1 in the transfer direction than the center of the first electrode 1 in the transfer direction. Here again, the electrically conductive cushioning member 11a may be disposed between the first electrode 1 and the side wiring 11b. In addition, the first board 11 may be electrically connected to the first electrode 1 by connection wiring without the side wiring 11b. The same applies to the second electrode 2.

In the image reading devices 40 to 53 according to Embodiments 1 and 2 described above, the light sources 18a, 18b, and 18c are light guides extending in the main scanning direction. However, the light sources 18a, 18b, and 18c are not limited to a light source having a light guide. The image reading device 54 illustrated in FIG. 24 includes a light source 18d instead of the light source 18a of the image reading device 53 illustrated in FIG. 22. In FIG. 24, the light source 18d is a light emitting diode (LED) array light source formed on a board extending in the main scanning direction and including LED elements arranged in the main scanning direction. The board included in the light source 18d has a main-scanning-direction length that is equal to or longer than the longitudinal-direction length or the transverse-direction length of the detection target 3.

Although the light source 18d illustrated in FIG. 24 is a light source for reflection light, the light source 18b that is a light source for reflection light and transmission light or the light source 18c that is a light source for transmission light source may be configured using the LED array light source. The light sources 18a, 18b, and 18c may also be formed using both the LED array light source and the light guide. The light sources 18a, 18b, and 18c may also be formed using the light guide simply as a condenser lens of the light source 18d. In addition, in the image reading devices 40 to 54 according to Embodiments 1 and 2, the light sources 18a, 18b, 18c, and 18d may be disposed outside the housings 13a, 13b, and 13c.

The capacitance detection devices 20 to 22 (image reading devices 40 to 54) according to Embodiments 1 and 2 described above can also be used with advantage for a device for detecting that foreign objects are attached on banknotes and securities that are representative examples of the detection target 3 and collecting or cutting the detected banknotes and securities to prevent recirculation.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese patent Application No. 2016-186875, filed on Sep. 26, 2016, the entire disclosure of which is incorporated by reference herein.

REFERENCE SIGNS LIST 1, 1b First electrode
2, 2b Second electrode
3 Detection target
5 Transfer path
6, 6b First plate
7, 7b Second plate
7c Cover glass
9, 9b Electric field
11 First board
11a, 12a Cushioning member
11b, 12b Side wiring
12 Second board
13a, 13b, 13c Housing
14 Image reader
15 Lens element
16 Sensor element
17 Circuit board
18a, 18b, 18c, 18d Light source
20, 21, 22, 30 Capacitance detection device
40, 41, 42, 43, 44, 45, 46, 47, 48, 49, 50, 51, 52, 53, 54 Image reading device

The invention claimed is:

1. A capacitance detection device, comprising:
a first electrode and a second electrode that at least partially face each other on opposite sides of a transfer path extending along a transfer direction in which a sheet-like detection target is transferred;
an oscillator circuit to form an electric field between the first electrode and the second electrode;
a detection circuit to detect a change in capacitance between the first electrode and the second electrode; and
a first board and a second board each including at least one of the oscillator circuit and the detection circuit,
wherein the first board has a side surface facing the first electrode in an electric field direction that is a direction in which the first electrode and the second electrode at least partially face each other, and
the second board has a side surface facing the second electrode in the electric field direction.

2. The capacitance detection device according to claim 1, further comprising:

a first plate that is insulating and includes the first electrode; and a second plate that is insulating and includes the second electrode.

3. The capacitance detection device according to claim 1, wherein the first electrode is electrically connected to the first board by an electrically conductive cushioning member, and the second electrode is electrically connected to the second board by an electrically conductive cushioning member.

4. The capacitance detection device according to claim 1, wherein the first board is electrically connected to the first electrode via connection wiring formed on the side surface of the first board.

5. The capacitance detection device according to claim 1, wherein the second board is electrically connected to the second electrode via connection wiring formed on the side surface of the second board.

6. The capacitance detection device according to claim 1, further comprising an identification circuit to determine, based on the change in capacitance detected by the detection circuit, a type of the detection target that is transferred.

7. The capacitance detection device according to claim 6, wherein when a further change in capacitance occurs while the detection target with the type determined passes in the electric field, the identification circuit determines, based on the further change, that a foreign object is attached on the detection target.

8. The capacitance detection device according to claim 1, further comprising an identification circuit to determine, based on the change in capacitance detected by the detection circuit, that a foreign object is attached on the detection target that is transferred.

9. The capacitance detection device according to claim 8, wherein when a further change in capacitance occurs while the detection target for which a determination is made that the foreign object is attached thereon passes in the electric field, the identification circuit determines, based on the change, a type of the foreign object attached on the detection target.

10. An image reading device, comprising:
the capacitance detection device according to claim 1;
a light source to irradiate the detection target with light; and
an image reader to read an image of the detection target,
wherein the first electrode and the second electrode are disposed on at least one of an upstream side and a downstream side of the image reader in the transfer direction of the transfer path.

11. The image reading device according to claim 10, wherein at least one of the first board and the second board has a main surface parallel to an optical axis of the image reader.

12. The image reading device according to claim 10, wherein
the first electrode extends along the transfer direction, and
the first electrode is electrically connected to the first board via connection wiring at a portion of the first electrode, the portion of the first electrode being farther away from the optical axis of the image reader adjacent to the first electrode in the transfer direction than a center of the first electrode in the transfer direction.

13. The image reading device according to claim 10, wherein the capacitance detection device comprising:
a first plate that is insulating and includes the first electrode; and
a second plate that is insulating and includes the second electrode,
wherein at least one of the first plate and the second plate has a transmittance of light that is equal to or greater than a threshold, the light being emitted from the light source.

14. The image reading device according to claim 13, wherein at least one of sets that are a set of the first plate and the first electrode and a set of the second plate and the second electrode has a transmittance of light that is equal to or greater than the threshold, the light being emitted from the light source.

15. The image reading device according to claim 13, wherein the image reader further comprises:
a lens element to focus, via at least one of the first plate and the second plate, light reflected on the detection target or light transmitted through the detection target; and
a sensor element to receive the light focused by the lens element,
wherein the image reader has an optical axis that is an optical axis of the lens element.

16. The image reading device according to claim 10, wherein the first electrode and the second electrode are located not to block an optical path from the light source to the detection target and an optical path from the detection target to the image reader.

17. The image reading device according to claim 10, wherein the capacitance detection device comprises:
a first plate that is insulating and includes the first electrode; and
a second plate that is insulating and includes the second electrode,
wherein the light source is disposed on a side opposite to the transfer path relative to the first plate or the second plate.

* * * * *